US010930767B2

(12) United States Patent
Ching et al.

(10) Patent No.: US 10,930,767 B2
(45) Date of Patent: Feb. 23, 2021

(54) FIN-LIKE FIELD EFFECT TRANSISTOR PATTERNING METHODS FOR ACHIEVING FIN WIDTH UNIFORMITY

(71) Applicant: Taiwan Semiconductor Manufacturing Co., Ltd., Hsin-Chu (TW)

(72) Inventors: Kuo-Cheng Ching, Hsinchu County (TW); Shi Ning Ju, Hsinchu (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/387,889

(22) Filed: Apr. 18, 2019

(65) Prior Publication Data

US 2020/0020782 A1    Jan. 16, 2020

Related U.S. Application Data

(60) Provisional application No. 62/698,536, filed on Jul. 16, 2018.

(51) Int. Cl.
*H01L 29/66* (2006.01)
*H01L 21/762* (2006.01)
(Continued)

(52) U.S. Cl.
CPC ...... *H01L 29/6681* (2013.01); *H01L 21/3086* (2013.01); *H01L 21/76224* (2013.01); *H01L 27/0886* (2013.01); *H01L 29/785* (2013.01)

(58) Field of Classification Search
None
See application file for complete search history.

(56) References Cited

U.S. PATENT DOCUMENTS 9,536,991 B1 * 1/2017 Zang ............... H01L 21/823431
2015/0162339 A1 * 6/2015 Divakaruni ....... H01L 21/02252
257/321

(Continued)

FOREIGN PATENT DOCUMENTS

CN    106571336 A    4/2017
KR    20180079160 A    7/2018

*Primary Examiner* — Steven M Christopher
(74) *Attorney, Agent, or Firm* — Haynes and Boone, LLP

(57) ABSTRACT

FinFET patterning methods are disclosed for achieving fin width uniformity. An exemplary method includes forming a mandrel layer over a substrate. A first cut removes a portion of the mandrel layer, leaving a mandrel feature disposed directly adjacent to a dummy mandrel feature. The substrate is etched using the mandrel feature and the dummy mandrel feature as an etch mask, forming a dummy fin feature and an active fin feature separated by a first spacing along a first direction. A second cut removes a portion of the dummy fin feature and a portion of the active fin feature, forming dummy fins separated by a second spacing and active fins separated by the second spacing. The second spacing is along a second direction substantially perpendicular to the first direction. A third cut removes the dummy fins, forming fin openings, which are filled with a dielectric material to form dielectric fins.

20 Claims, 17 Drawing Sheets

(51) Int. Cl.
*H01L 27/088* (2006.01)
*H01L 29/78* (2006.01)
*H01L 21/308* (2006.01)

(56) References Cited

U.S. PATENT DOCUMENTS

| | | |
|---|---|---|
| 2016/0218222 A1* | 7/2016 | Divakaruni ....... H01L 21/02238 |
| 2018/0040713 A1 | 2/2018 | Chang et al. |
| 2018/0040727 A1 | 2/2018 | Anderson et al. |
| 2018/0122801 A1 | 5/2018 | Greene et al. |
| 2018/0190652 A1 | 7/2018 | Ching et al. |

* cited by examiner

FIN-LIKE FIELD EFFECT TRANSISTOR PATTERNING METHODS FOR ACHIEVING FIN WIDTH UNIFORMITY

This is a non-provisional application of and claims benefit of U.S. Provisional Patent Application Ser. No. 62/698,536, filed Jul. 16, 2018, the entire disclosure of which is incorporated herein by reference.

BACKGROUND

The semiconductor integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as fin-like field effect transistor (FinFET) technologies progress towards smaller feature sizes (such as 32 nanometers, 28 nanometers, 20 nanometers, and below), FinFET patterning processes are significantly constrained by decreasing process margins. Accordingly, although existing fin patterning processes have been generally adequate for their intended purposes, they have not been entirely satisfactory in all respects

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
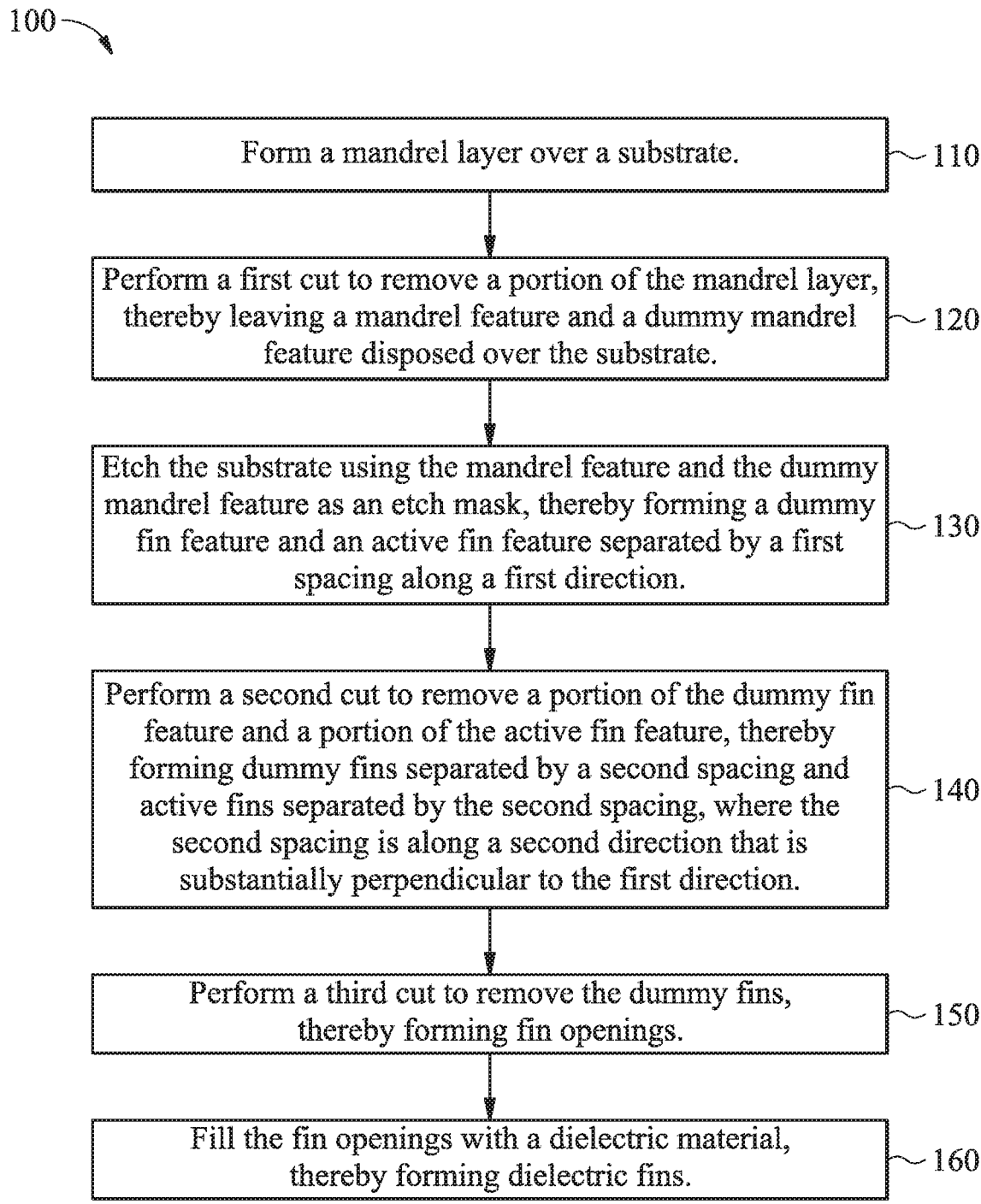
FIG. 1 is a flow chart of a method for fabricating a fin-like field effect transistor (FinFET) device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a flow chart of a method 100 for fabricating an integrated circuit (IC) device according to various aspects of the present disclosure. In some implementations, the IC device includes a fin-like field effect transistor (FinFET) device, which generally refers to any fin-based transistor device, such as a fin-based, multi-gate transistor. At block 110, method 100 includes forming a mandrel layer over a substrate. At block 120, a first cut is performed to remove a portion of the mandrel layer, thereby leaving a mandrel feature and a dummy mandrel feature disposed over the substrate. The dummy mandrel feature is disposed directly adjacent to the mandrel feature. At block 130, method 100 proceeds with etching the substrate using the mandrel feature and the dummy mandrel feature as an etch mask, thereby forming a dummy fin feature and an active fin feature. The dummy fin feature is separated from the active fin feature by a first spacing along a first direction. At block 140, a second cut is performed to remove a portion of the dummy fin feature and a portion of the active fin feature, thereby forming dummy fins separated by a second spacing and active fins separated by the second spacing. The second spacing is along a second direction that is substantially perpendicular to the first direction. At block 150, a third cut is performed to remove the dummy fins, thereby forming fin openings. At block 160, the fin openings are filled with a dielectric material, thereby forming dielectric fins. In some implementations, method 100 may continue to fabricate other features of the IC device. Additional steps can be provided before, during, and after method 100, and some of the steps described can be moved, replaced, or eliminated for additional embodiments of method 100. The discussion that follows illustrates FinFET devices that can be fabricated according to various embodiments of method 100.

Figure 2A:
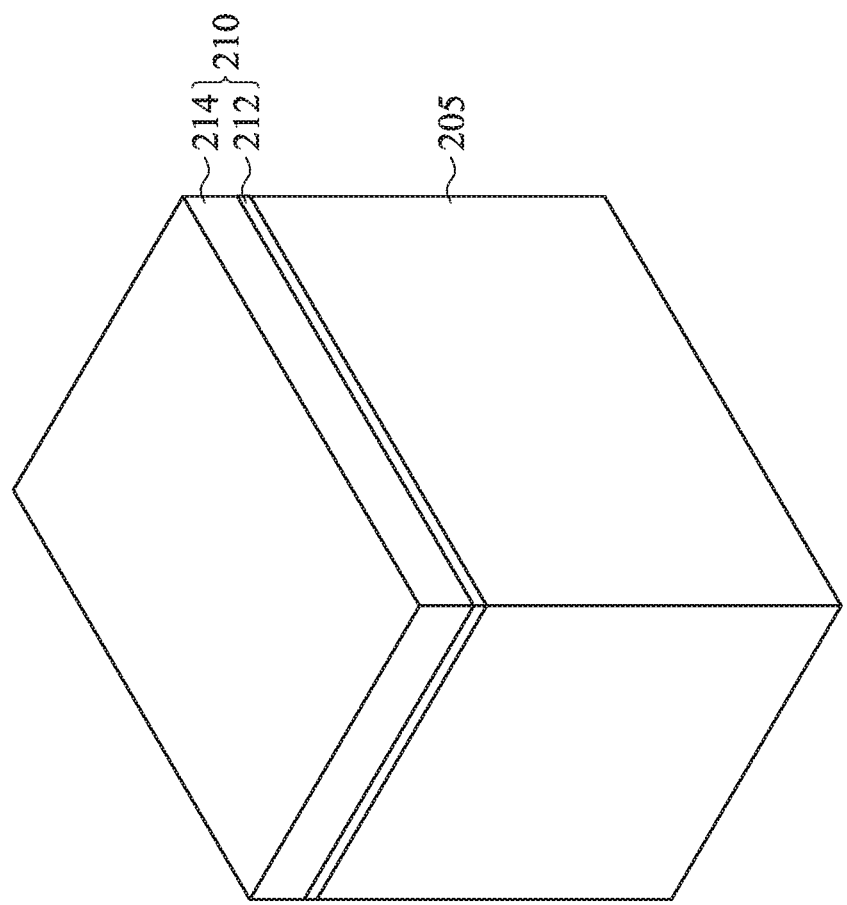
FIGS. 2A-2P are fragmentary diagrammatic views of a FinFET device, in portion or entirety, at various fabrication stages, such as those associated with the method of FIG. 1, according to various aspects of the present disclosure.
Figure 2B:
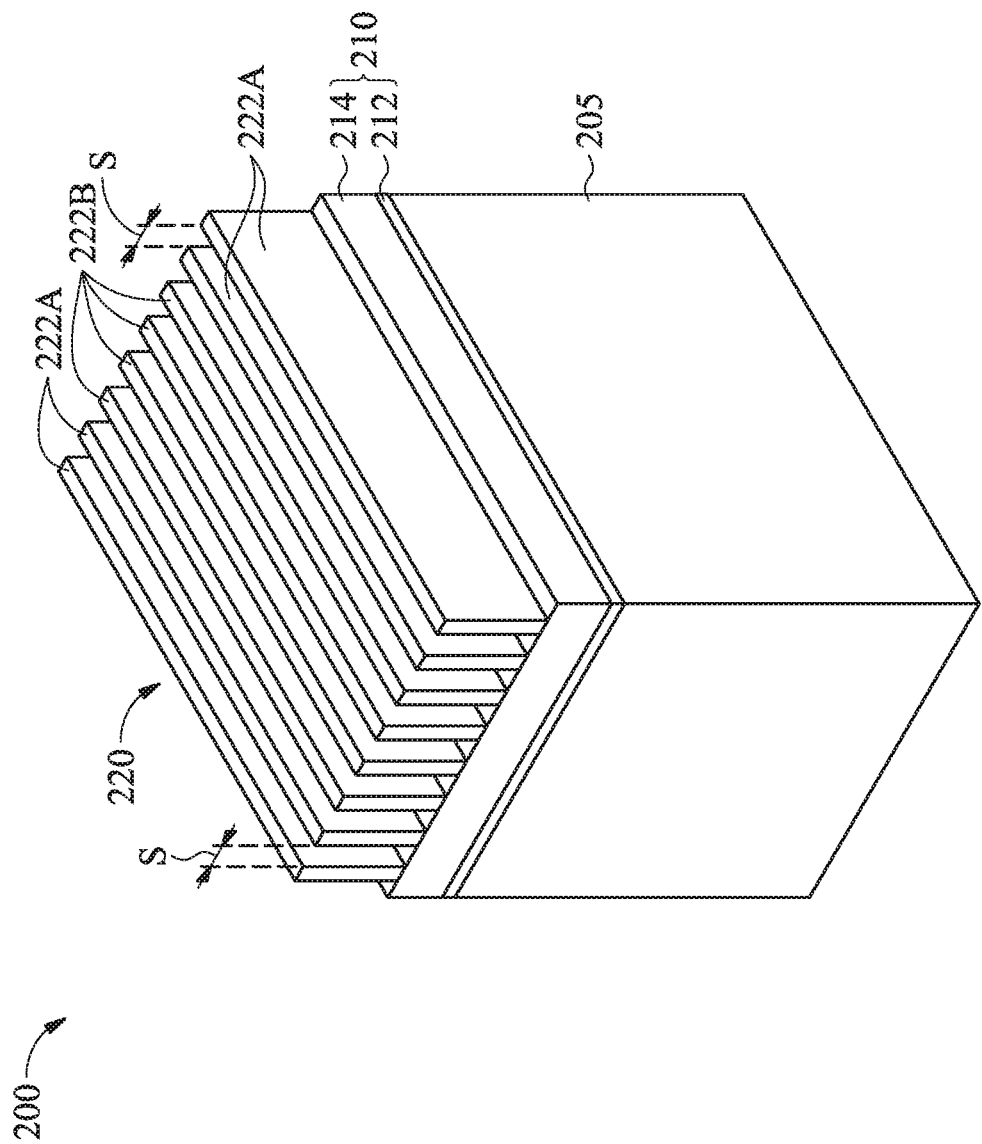
Figure 2C:
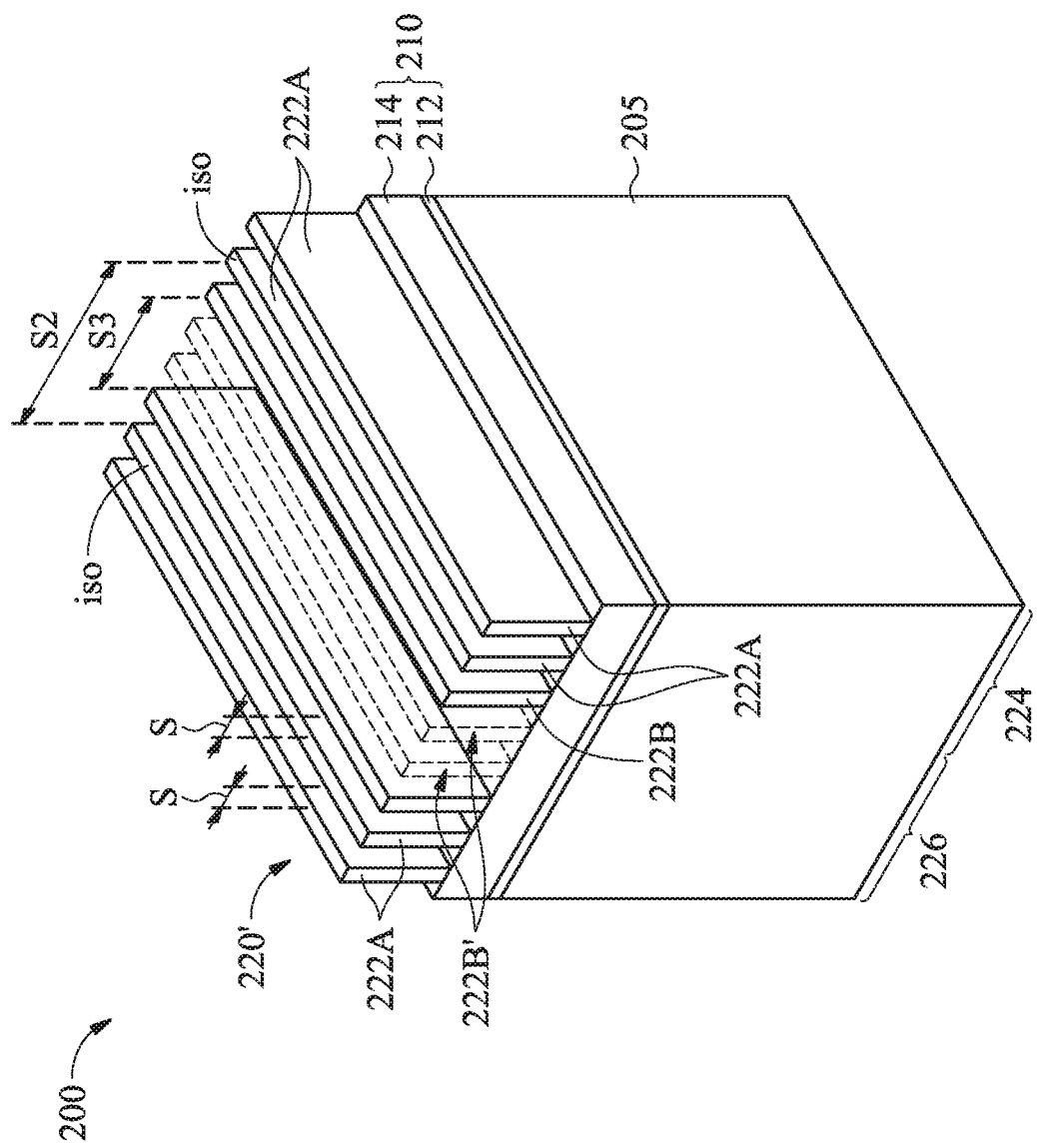
Figure 2D:
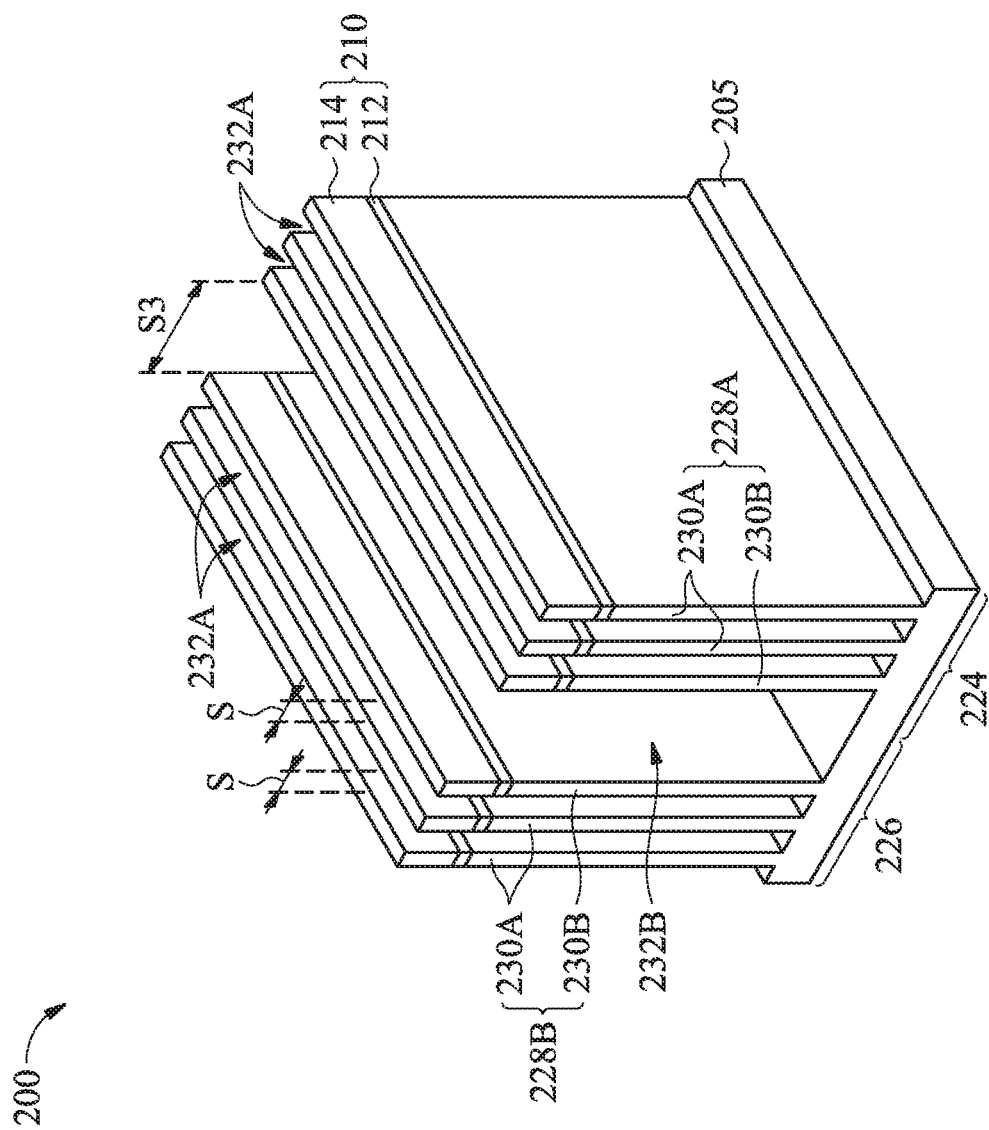
Figure 2E:
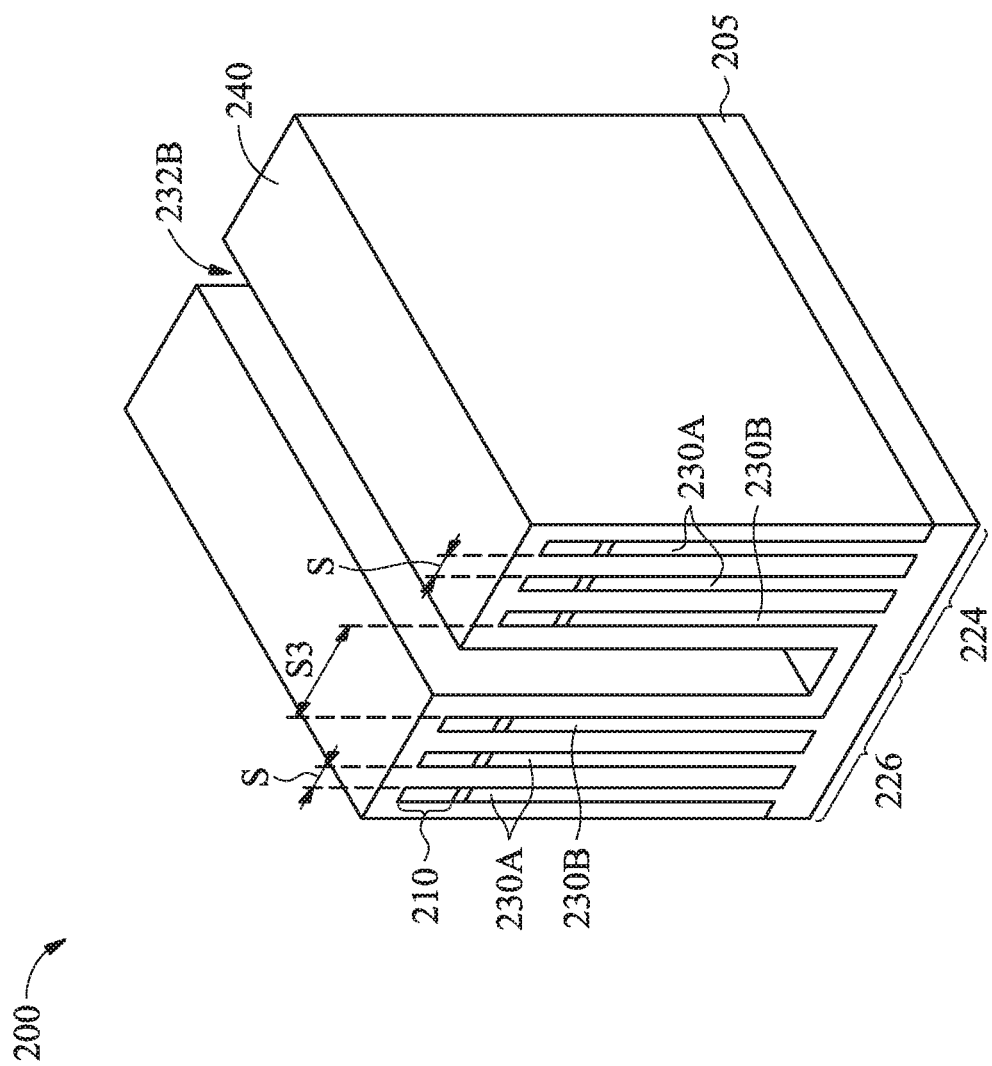
Figure 2F:
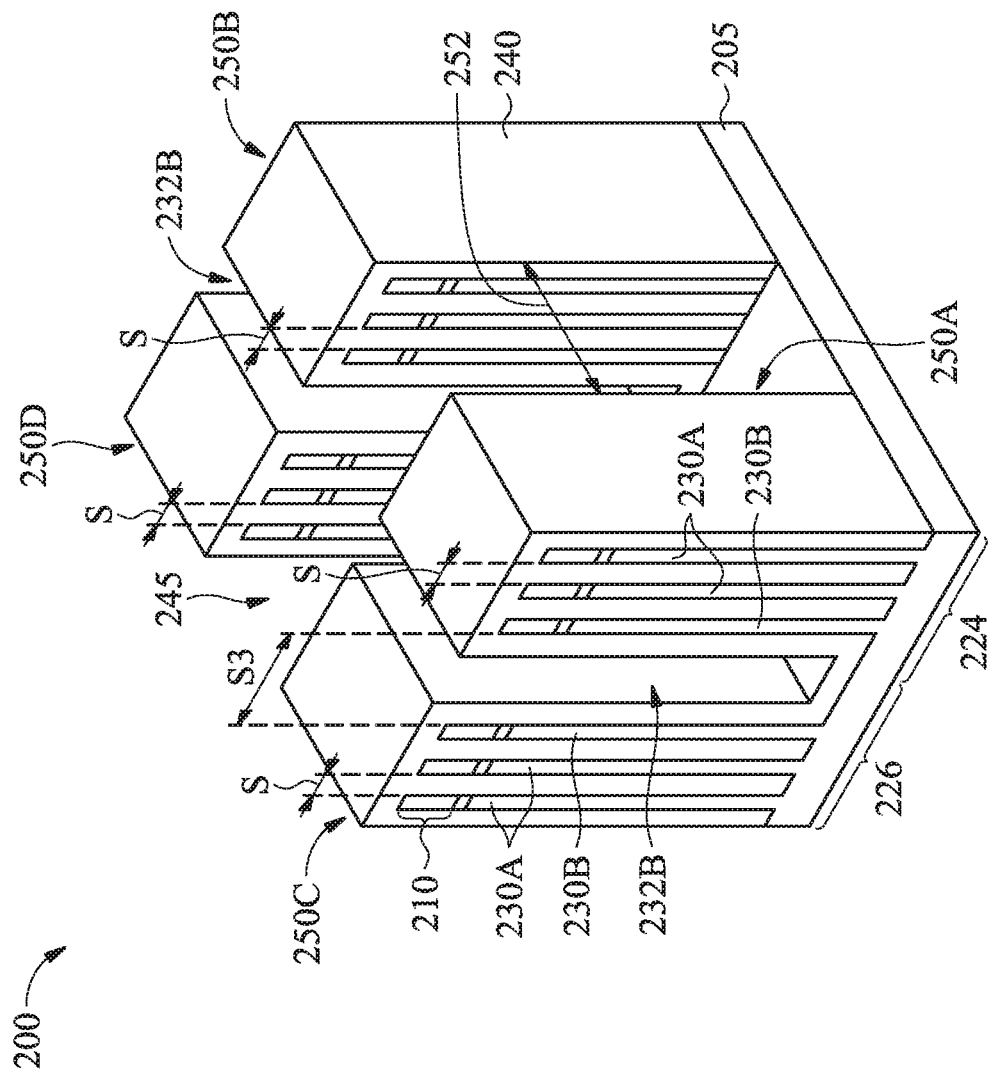
Figure 2G:
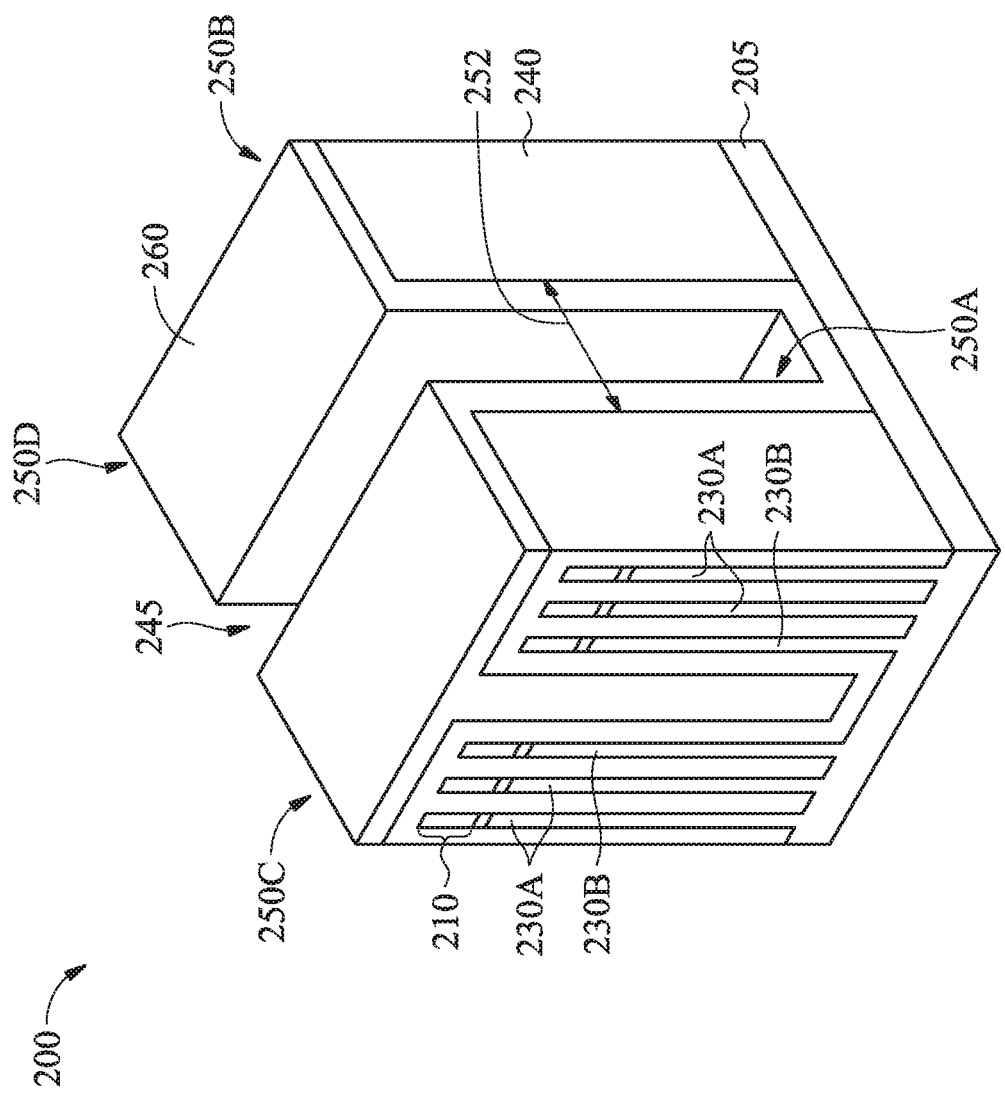
Figure 2H:
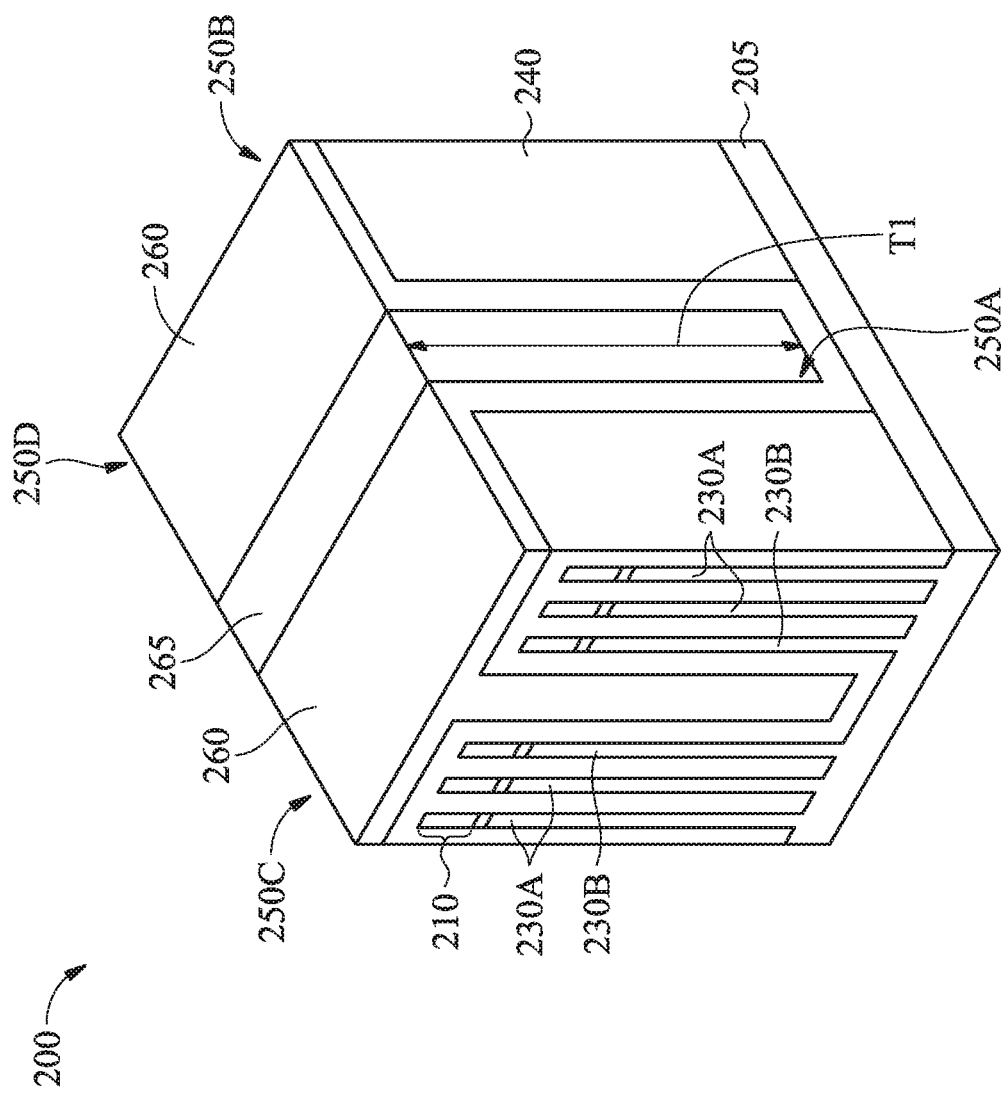
Figure 2I:
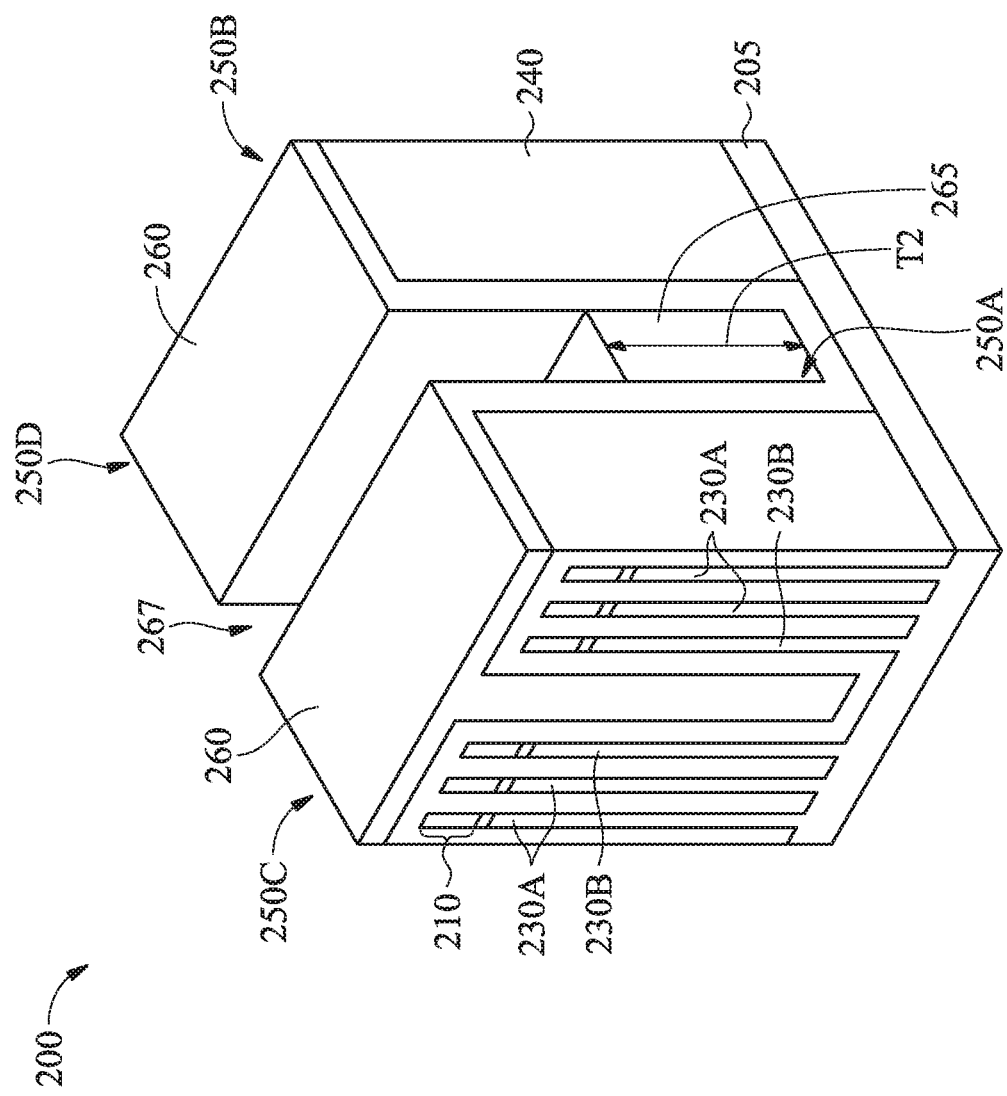
Figure 2J:
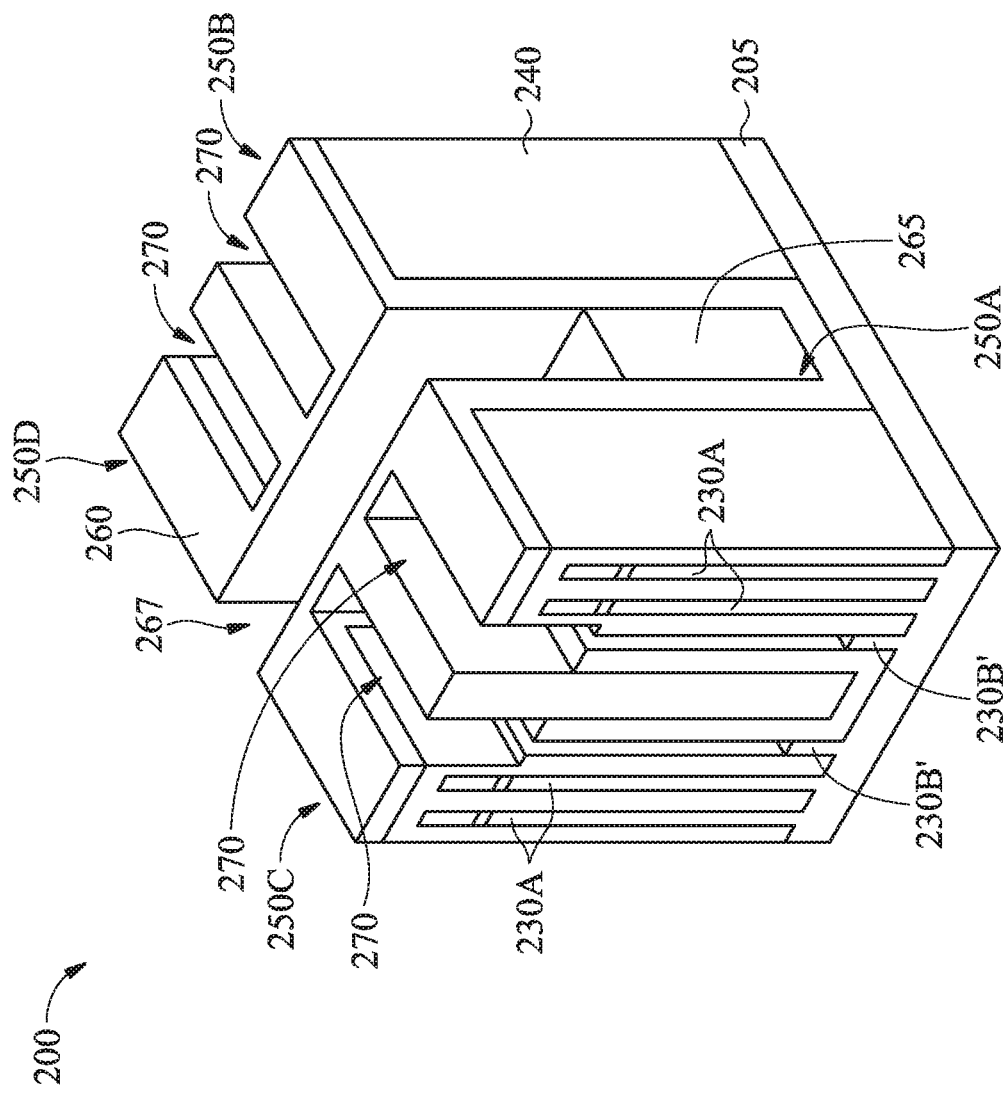
Figure 2K:
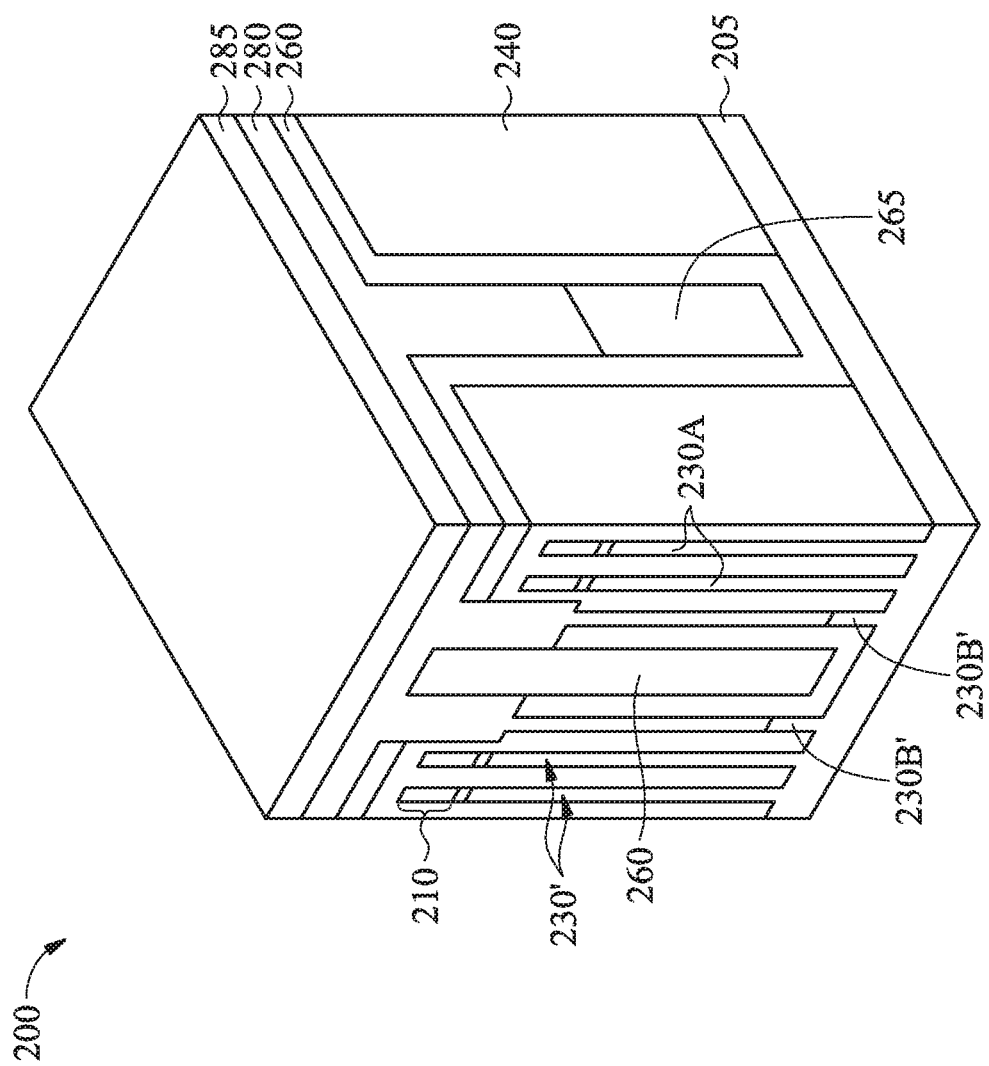
Figure 2L:
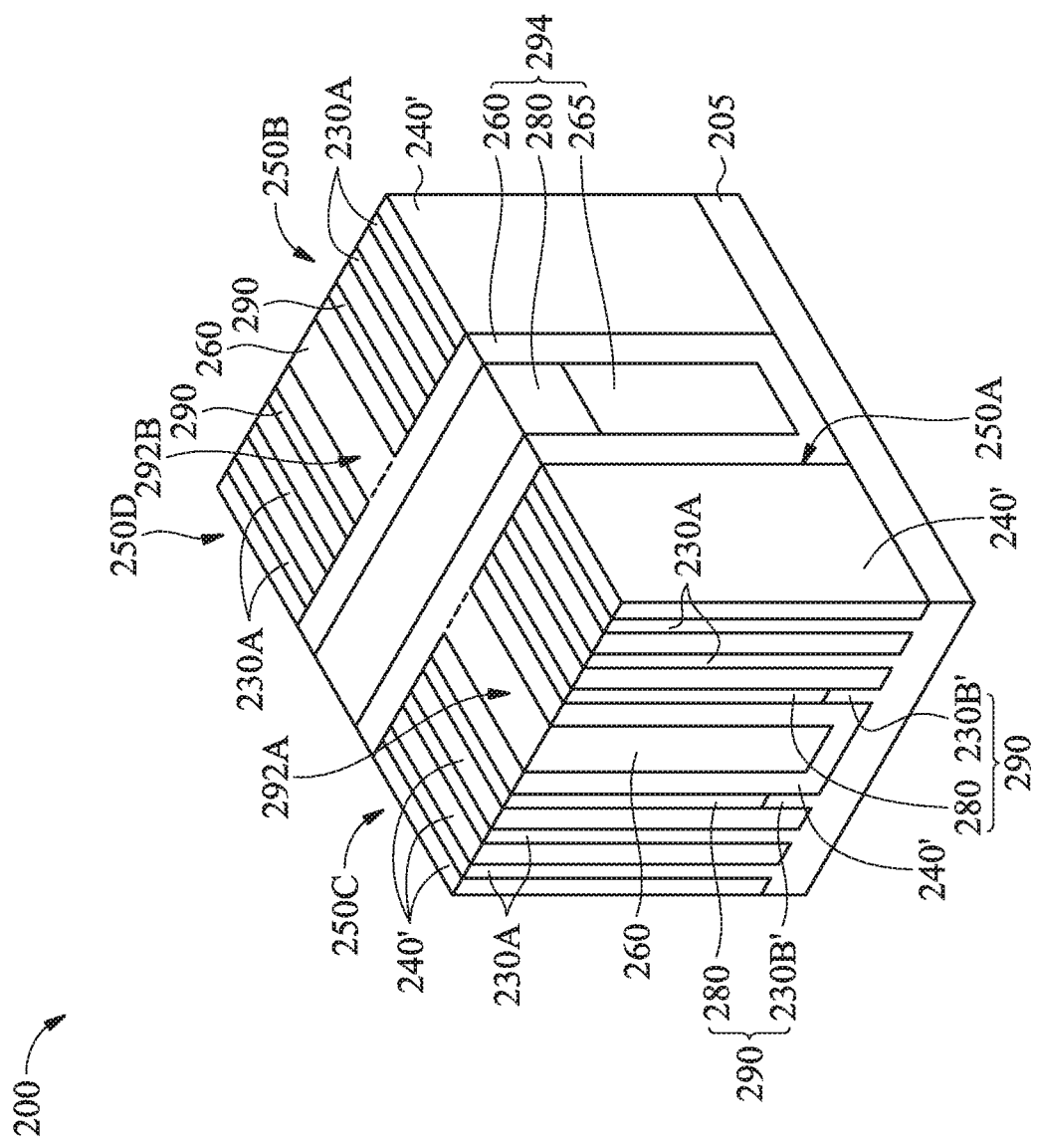
Figure 2M:
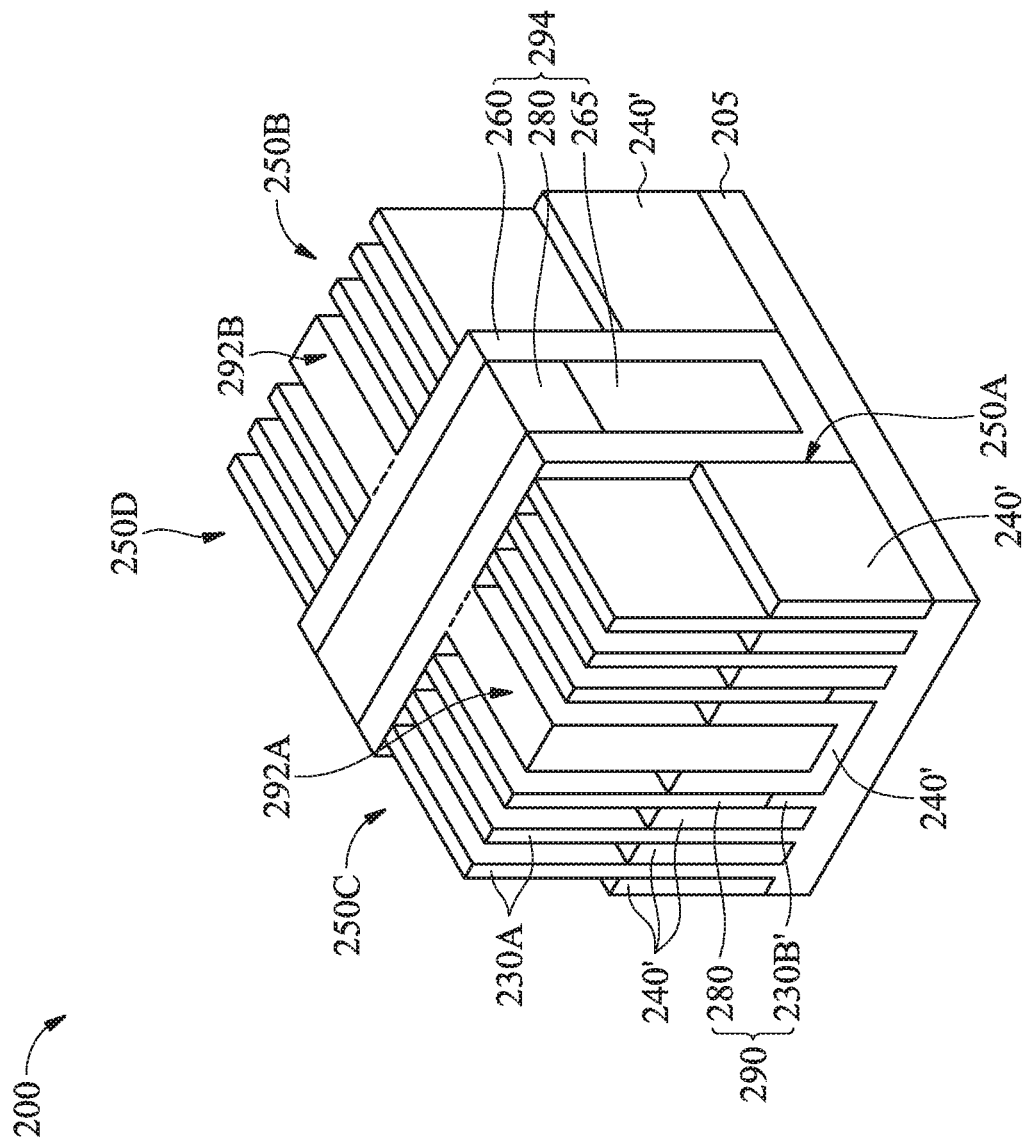
Figure 2N:
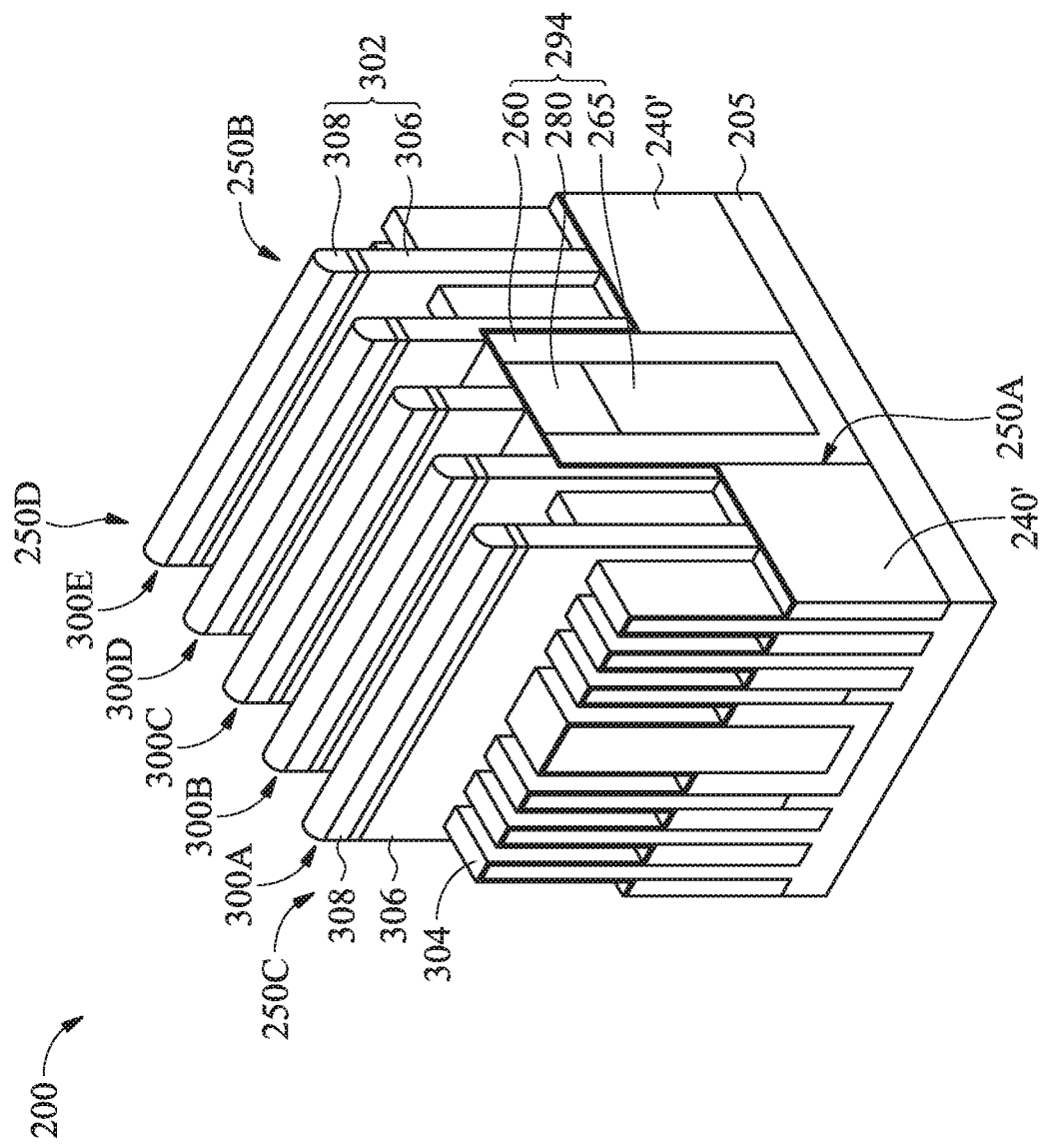
Figure 2O:
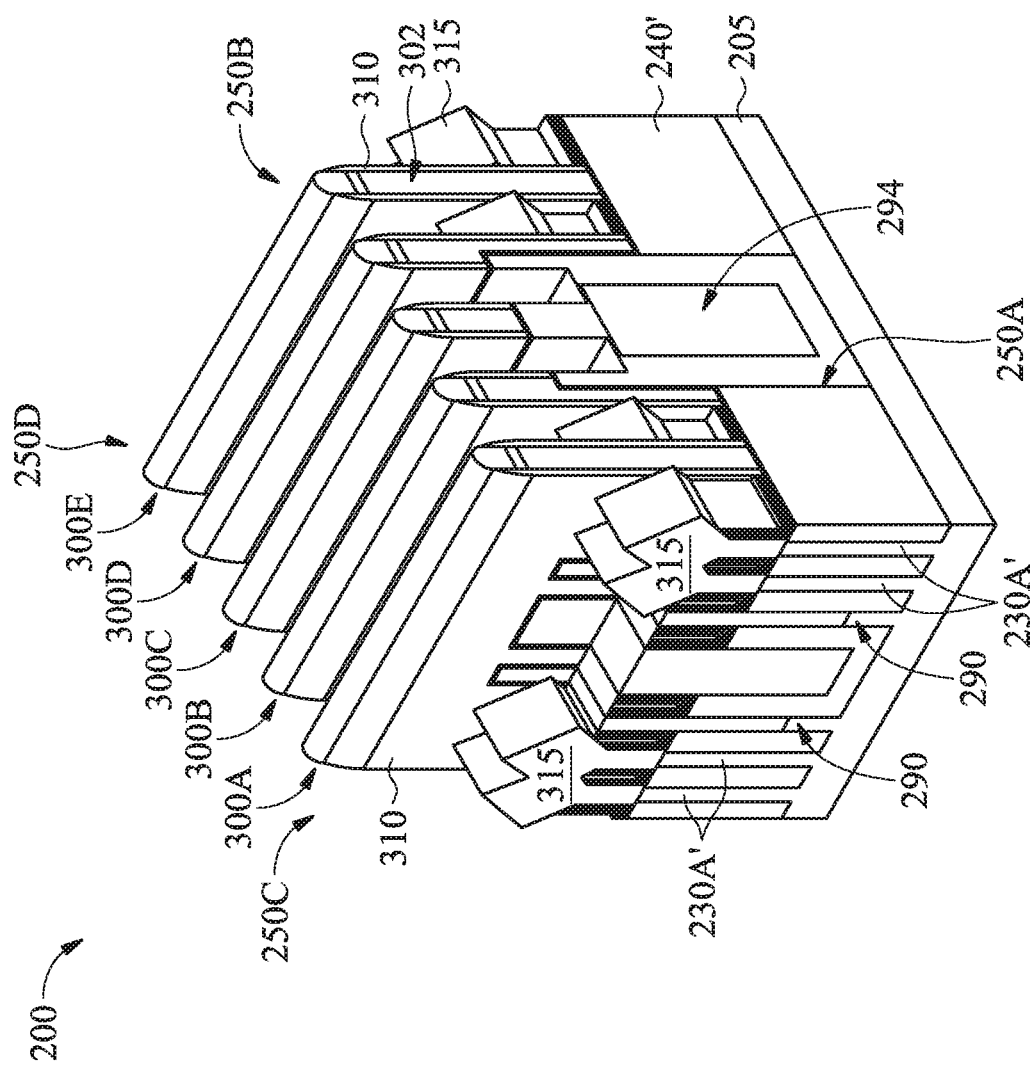
Figure 2P:
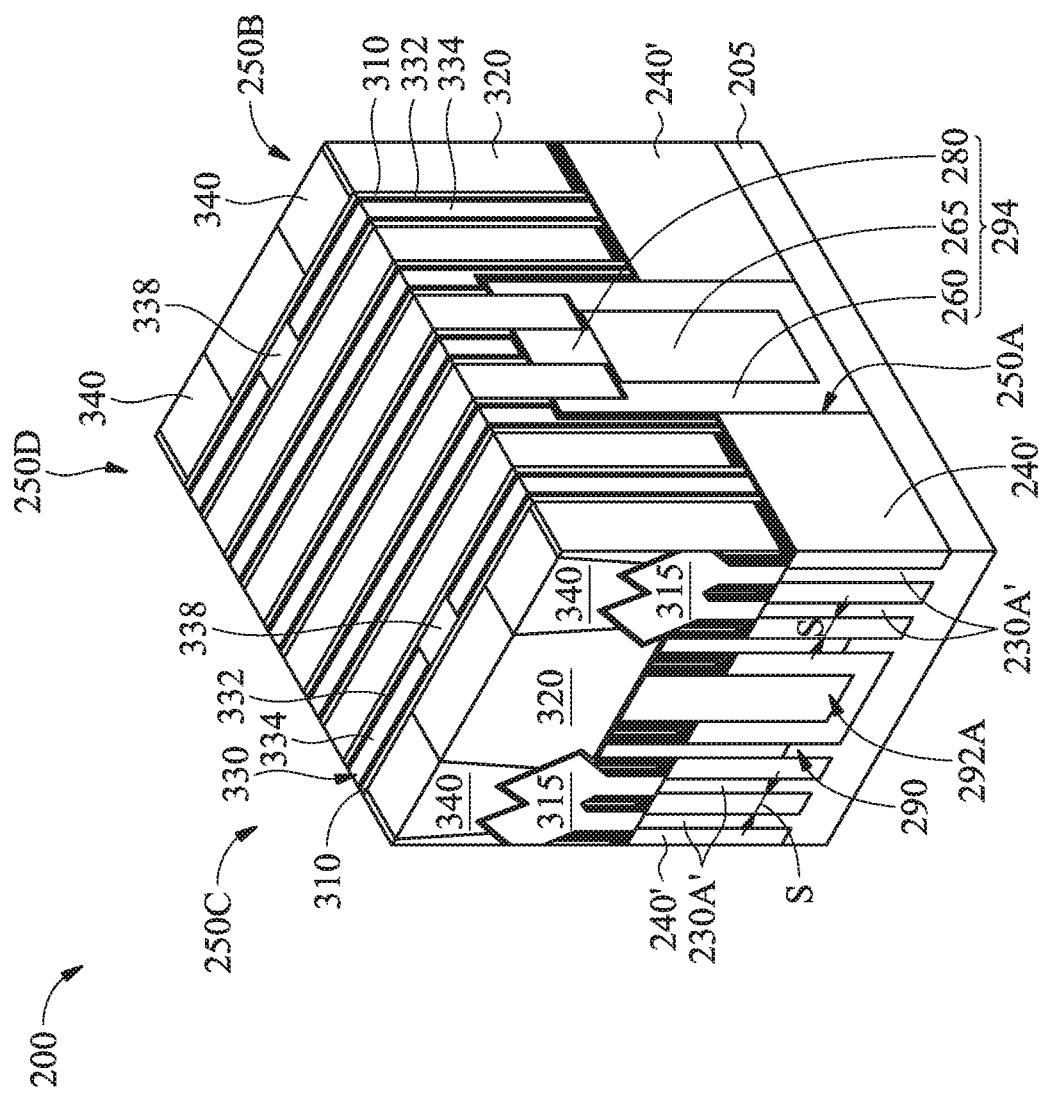

FIGS. 2A-2P are fragmentary diagrammatic views of a FinFET device 200, in portion or entirety, at various fabrication stages (such as those associated with method 100) according to various aspects of the present disclosure. FinFET device 200 may be included in a microprocessor, a memory, and/or other IC device. In some implementations, FinFET device 200 may be a portion of an IC chip, a system on chip (SoC), or portion thereof, that includes various passive and active microelectronic devices such as resistors, capacitors, inductors, diodes, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIGS. 2A-2P have been simplified for the sake of clarity to better understand the inventive concepts of the present disclosure.

Additional features can be added in FinFET device 200, and some of the features described below can be replaced, modified, or eliminated in other embodiments of FinFET device 200.

In FIGS. 2A-2D, a fin cut first process is performed to define active regions of FinFET device 200. The fin cut first process implements a multiple patterning process, such as a double patterning lithography (DPL) process (for example, a lithography-etch-lithography-etch (LELE) process, a self-aligned double patterning (SADP) process, a spacer-is-dielectric patterning (SIDP) process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Generally, multiple patterning processes combine lithography processes and self-aligned processes, allowing patterns to be created that have, for example, pitches smaller than what is otherwise obtainable using a single, direct lithography process. For example, in some implementations, a patterned sacrificial layer is formed over a substrate using a lithography process, and spacers are formed alongside the patterned sacrificial layer using, for example, a self-aligned process. Then, the patterned sacrificial layer is removed, and the spacers can be used to pattern an underlying layer. In some implementations, directed self-assembly (DSA) techniques are implemented during the multiple patterning processes. The present disclosure contemplates variations to the fin cut first process described below and notes that various steps may be omitted for ease of discussion.

Turning to FIG. 2A, FinFET device 200 includes a substrate (wafer) 205. In the depicted embodiment, substrate 205 is a bulk substrate that includes silicon. Alternatively, in some implementations, substrate 205 includes a bulk substrate (including, for example, silicon) and one or more material layers disposed over the bulk substrate. For example, the one or more material layers can include a semiconductor layer stack having various semiconductor layers (such as a heterostructure) disposed over the bulk substrate, where the semiconductor layer stack is subsequently patterned to form fins. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of FinFET device 200. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b/Si_cGe_d/Si_aGe_b$ from bottom to top, where a, c are different atomic percentages of silicon and b, d are different atomic percentages of germanium). Alternatively or additionally, the bulk substrate and/or the one or more material layers include another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-V materials; or combinations thereof. Alternatively, substrate 205 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

A patterning layer 210 is disposed over substrate 205. Patterning layer 210 includes a material that is different than a material of substrate 205 to achieve etching selectivity during a fin etching process, such that substrate 205 can be selectively etched with minimal (or no) etching of patterning layer 210, and vice versa. In the depicted embodiment, patterning layer 210 includes a pad layer 212 and a mask layer 214, where pad layer 212 is disposed on substrate 205 and mask layer 214 is disposed on pad layer 212. In some implementations, pad layer 212 includes silicon and oxygen (for example, silicon oxide), and mask layer 214 includes silicon and nitrogen (for example, silicon nitride or silicon oxynitride). In some implementations, pad layer 212 is a silicon oxide layer formed by thermal oxidation and/or other suitable process, and mask layer 214 is a silicon nitride layer formed by chemical vapor deposition (CVD), low pressure CVD (LPCVD), plasma enhanced CVD (PECVD), thermal nitridation (for example, of silicon), other suitable process, or combinations thereof. In some implementations, pad layer 212 includes a material that promotes adhesion between substrate 205 and mask layer 214 and/or functions as an etch stop layer when etching mask layer 214. Other materials for and/or methods for forming pad layer 212 and/or mask layer 214, along with other configurations of patterning layer 210, are contemplated by the present disclosure.

Turning to FIG. 2B, a mandrel layer 220 is formed over patterning layer 210. Mandrel layer 220 includes an array of mandrels disposed on patterning layer 220, where adjacent mandrels are separated by spacing S. In the depicted embodiment, mandrel layer 220 includes mandrels 222A, which correspond with active fins to be formed in a portion of substrate 205, and dummy mandrels 222B, which correspond with extra mandrel features that are included within mandrel layer 220 to maintain mandrel feature density (and thus minimize patterning effects, such as fin etch loading effects, that can affect uniformity) and/or correspond with dielectric fins to be formed in a portion of substrate 205, where the dielectric fins are electrically non-functional features of FinFET device 200. In some implementations, widths of mandrels 222A are substantially equal to desired widths (also referred to as critical dimensions (CDs)) of fins of FinFET device 200. In some implementations, widths of mandrels 222A are greater than the desired widths of fins of FinFET device 200 to compensate for consumption of the fins and/or patterning layers used to form the fins during subsequent processing (for example, to compensate for etch loading effects). Mandrel layer 220 includes a material that is different than patterning layer 210 (in particular, mask layer 214) to achieve etching selectivity during an etching process, such that patterning layer 210 can be selectively etched with minimal (or no) etching of mandrel layer 220, and vice versa. Mandrel layer 220 includes a semiconductor material and/or a dielectric material that achieves desired etching selectivity, such as silicon, amorphous silicon, silicon oxide, silicon nitride, silicon oxynitride, silicon carbide, other suitable material, or combinations thereof.

In the depicted embodiment, mandrel layer 220 is formed using a spacer patterning technique. For example, forming mandrel layer 220 includes forming a patterned sacrificial layer (which includes sacrificial features having a first spacing) over patterning layer 210 using a lithography process, forming a spacer layer over the patterned sacrificial layer, etching the spacer layer to form spacers along sidewalls of each sacrificial feature (for example, the spacer layer is removed from a top surface of the sacrificial features and a portion of a top surface of patterning layer 210), and removing the patterned sacrificial layer, leaving spacers having a second spacing (which can be referred to as a patterned spacer layer, which includes openings that expose a portion of patterning layer 210). Mandrel layer 220 and mandrels 222A, 222B can thus respectively be referred to as a spacer layer and spacers. In some implementations, the spacer layer is conformally formed over the patterned sacrificial layer, such that the spacer layer has a substantially uniform thickness. In some implementations, the spacers are trimmed before or after removing the patterned sacrificial layer. Alternatively, in some implementations, mandrel layer 220 is formed by forming a mandrel material layer (including, for example, a dielectric material), forming a patterned resist layer over the mandrel material layer using a lithography process, etching the mandrel material layer using the patterned resist layer as an etch mask, and removing the patterned resist layer (for example, by a resist stripping process), leaving a patterned mandrel material layer that includes openings that expose patterning layer 110. Alternatively, in some implementations, mandrel layer 220 is a patterned resist layer, such that mandrel layer 220 includes a resist material. The lithography processes can include forming a resist layer (for example, by spin-on coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The patterned resist layer can then be used as an etch mask during an etching process to remove portions of an underlying layer, such as a sacrificial layer or a mandrel material layer. The etching process can include a dry etching process (for example, a reactive ion etching (RIE) process), a wet etching process, other suitable etching process, or combinations thereof. After the etching process, the patterned resist layer can be removed. Alternatively, the exposure process can implement maskless lithography, electron-beam writing, ion-beam writing and/or nanoprint technology.

Turning to FIG. 2C, dummy mandrels 222B of mandrel layer 220 are removed to define fin active regions of FinFET device 200, such as a fin active region 224 and a fin active region 226, thereby forming patterned mandrel layer 220'. In the depicted embodiment, fin active region 224 is directly adjacent to fin active region 226, such that no other fin active region is disposed between fin active region 224 and fin active region 226. Typically, the fin cut first process would continue by removing all dummy mandrels 222B, such that only mandrels 222A corresponding with active fins to be formed in substrate 205 remain. However, it has been observed that density variations arising from such fin cut first techniques can result in etching effects that induce fin width (or fin CD) differences in active fins that can negatively affect FinFET device performance. For example, when dummy mandrels 222B are completely removed from mandrel layer 220, a spacing S2 is defined between mandrels 222A in directly adjacent fin active regions, which results in areas surrounding each mandrel 222A having different densities. The different densities can result in fin active region 224 and fin active region 226 having an isolated (iso) mandrel and a dense mandrel, where left/right spacing of the iso mandrel is greater than left/right spacing of the dense mandrel. Left/right spacing (loading) generally refers to a sum of a spacing between a left sidewall of a mandrel and a closest device feature (for example, another mandrel or an edge of substrate 205) along a width direction (here, the x-direction) of the mandrel and a spacing between a right sidewall of the mandrel and a closest device feature along the width direction. In other words, L/R loading=L spacing+R spacing. In some implementations, a threshold left/right loading is defined for classifying a mandrel as an iso mandrel or a dense mandrel. For purposes of the present example, it is assumed that the left/right loading corresponding with outermost mandrels 222A is less than the threshold left/right loading, such that the outermost mandrels 222A are classified as dense mandrels and innermost mandrels 222A are classified as iso mandrels (FIG. 2C).

Since left/right loading of mandrels 222A is subsequently transferred to active fins (when mandrels 222A are used as an etch mask to form the active fins), an area of substrate 205 that corresponds with iso mandrels may etch differently (for example, more quickly or more slowly in one or more directions depending on whether the etching is configured anisotropically or isotropically) than an area of substrate 205 that corresponds with dense mandrels, such that widths of active fins corresponding with iso mandrels are different than widths of active fins corresponding with dense mandrels. Such etching differences resulting from left/right loading are often referred to as fin etch iso/dense loading. In some implementations, it has been observed that an area of substrate 205 that corresponds with iso mandrels etches more slowly than an area of substrate 205 that corresponds with dense mandrels, such that widths of active fins corresponding with iso mandrels (referred to as iso fins) are greater than widths of active fins corresponding with dense mandrels (referred to as dense fins). Such fin etch iso/dense loading has led to less control of short channel effects in iso fins compared to dense fins (for example, increases in drain induced barrier lowering (DIBL)), degrading FinFET device performance and/or resulting in undesired variations in FinFET device performance. Further, as IC technology nodes continue to decrease, these issues are exacerbated by ever-shrinking gate lengths in FinFET devices fabricated at the advanced IC technology nodes.

The present disclosure proposes inserting dummy fins adjacent to isolated active fins, such as edge fins of a FinFET device, to reduce left/right loading of isolated active fins. Density in an area of isolated active fins is thus closer (and, in some implementations, equivalent) to density in an area of dense active fins, thereby reducing fin etch iso/dense loading and improving fin width uniformity. For example, in FIG. 2C, the fin cut first process removes a subset of dummy mandrels 222B' (instead of all of dummy mandrels 222B), such that fin region 224 and fin region 226 each have one of dummy mandrels 222B disposed adjacent to mandrels 222A that are classified as iso mandrels. In the depicted embodiment, remaining dummy mandrels 222B are disposed directly adjacent to mandrels 222A, thereby defining a spacing S3 between dummy mandrels 222B in fin active region 224 and fin active region 226 that is less than spacing S2. Remaining dummy mandrels 222B reduce left/right loading of innermost mandrels 222A (for example, from S+S2 to S+S). In some implementations, left/right loading of innermost mandrels 222A is substantially equal to left/right loading of outermost mandrels 222A. For example, left/right loading of innermost mandrels 222A and outermost mandrels 222A is S+S. The present disclosure contemplates any subset of dummy mandrels removed, so long as remaining dummy mandrels reduce left/right loading of isolated mandrels, such as innermost mandrels 222A, to less than or equal to a threshold left/right loading. In some implementations, when spacing between mandrels of fin active regions, such as spacing S2, is greater than or equal to a threshold spacing (for example, defining a spacing that has been determined to result in unacceptable levels of fin etch iso/dense loading), the fin cut first process leaves at least one dummy mandrel in each fin active region to define a spacing, such as spacing S3, between dummy fins of the fin active regions. In such implementations, when spacing between mandrels of fin active regions is less than the threshold spacing, all dummy mandrels are removed between mandrels defining the fin active regions.

Removing subset of dummy mandrels 222B' includes forming a patterned masking layer over mandrel layer 220 that includes a cut pattern defining protected mandrels (here, mandrels 222A and at least one dummy mandrel 222B disposed adjacent to each mandrel 222A classified as an iso mandrel) and unprotected (unwanted) mandrels (here, subset of dummy mandrels 222B') and etching the unprotected mandrels using the patterned masking layer as an etch mask. In some implementations, the cut pattern defines an opening in the patterned masking layer that exposes the unprotected mandrels. In some implementations, the patterned masking layer is a patterned resist layer formed by a lithography process, such as those described herein. In some implementations, the patterned masking layer is a patterned hard mask layer, which is formed by depositing a hard mask layer over mandrel layer 220, forming a patterned resist layer having the cut pattern using a lithography process, such as those described herein, and etching the hard mask layer using the patterned resist layer as an etch mask, such that the patterned hard mask layer includes the cut pattern exposing the unprotected mandrels. In some implementations, the patterned masking layer has a multi-layer structure. In some implementations, subset of dummy mandrels 222B' is selectively etched without etching (or without significantly etching) the patterned masking layer. The etching process is a dry etching process, a wet etching process, or combinations thereof. Various etching parameters can be tuned to selectively etch subset of dummy mandrels 222B', such as etchant composition, etching temperature, etching solution concentration, etching time, etching pressure, source power, RF bias voltage, RF bias power, etchant flow rate, other suitable etching parameters, or combinations thereof. In some implementations, a wet etching process uses an etching solution that includes tetramethylammonium hydroxide (TMAH), hydrofluoric acid (HF), sulfuric acid ($H_2SO_4$), hydrogen chloride (HCl), ammonium hydroxide ($NH_4OH$), hydrogen peroxide ($H_2O_2$), other suitable wet etching constituent, or combinations thereof. Thereafter, the patterned masking layer is removed (for example, by a resist stripping process and/or a selective etching process), leaving mandrels 222A and dummy mandrels 222B as depicted in FIG. 2C.

Turning to FIG. 2D, a fin etching process is performed to define a fin structure 228A and a fin structure 228B (collectively referred to as a fin layer) in a portion of substrate 205 using mandrel layer 220' as an etch mask. Fin structure 228A is disposed in fin active region 224, and fin structure 228B is disposed in fin active region 226. In the depicted embodiment, fin structure 228A and fin structure 228B each include two active fins 230A and one dummy fin 232B, where dummy fins 232B are configured between active fins 230A of adjacent fin structures 228A, 228B. Spacing of mandrel layer 220' is transferred to the fin layer, such that fins of fin structures 228A, 228B are separated by spacing S and dummy fins 230B of fin structures 228A, 228B are separated by spacing S3. Active fins 230A and dummy fins 230B are oriented substantially parallel to one another, each having a width defined in an x-direction, a length defined in a y-direction, and a height defined in a z-direction. Active fins 230A and dummy fins 230B have substantially the same widths, lengths, and heights. In the depicted embodiment, where substrate 205 is a bulk substrate that includes silicon, active fins 230A and dummy fins 230B include silicon. Alternatively, in some implementations, where substrate 205 includes a semiconductor layer stack disposed over a bulk substrate, active fins 230A and dummy fins 230B are defined in the semiconductor layer stack, such that active fins 230A and dummy fins 230B include one or more semiconductor material layers. In furtherance of the depicted embodiment, trenches 232A are defined between fins of fin structures 228A, 228B, and a trench 232B is defined between adjacent fin structures 228A, 228B (here, between dummy fin 230B of fin structure 228A and dummy fin 230B of fin structure 228B). Trenches 232A, 232B have sidewalls defined by sidewalls of active fins 230A, dummy fins 230B, and/or patterning layer 210 and bottoms defined by top surfaces of substrate 205.

The fin etching process selectively etches patterning layer 210 and substrate 205 without etching (or without significantly etching) mandrel layer 220', such that mandrels 222A and dummy mandrels 222B serve as an etch mask for removing portions of patterning layer 210 and substrate 205. Inserting dummy fins 230B (which correspond with remaining dummy mandrels 222B) adjacent to innermost, isolated active fins 230A (which correspond with innermost mandrels 222A classified as iso mandrels) reduces fin etch iso/dense loading, such that widths of innermost active fins 230A are substantially similar to widths of outermost active fins 220B. In some implementations, an area of substrate 205 corresponding with innermost mandrels 222A etches at about the same rate as an area of substrate 205 corresponding with outermost mandrels 222A. In some implementations, fin etch iso/dense loading is reduced by as much as 45% compared to fin etch iso/dense loading that arises during conventional fin cut first processes. The etching process is a dry etching process, a wet etching process, or combinations thereof. In some implementations, the fin etching process is an anisotropic dry etching process (for example, a RIE process) configured to substantially remove patterning layer 210 and a portion of substrate 205 along the y-direction without removal (or without significant removal) of patterning layer 210 and the portion of substrate 205 along the x-direction. In some implementations, a dry etching process uses a fluorine-containing precursor (for example, $CF_4$, $SF_6$, $NF_3$, $CH_2F_2$, $CHF_3$, and/or $C_2F_6$), an oxygen-containing precursor, a chlorine-containing precursor (for example, $Cl_2$, $CHCl_3$, $CCl_4$, and/or $BCl_3$), a bromine-containing precursor (for example, HBr and/or $CHBR_3$), an iodine-containing precursor, other suitable precursor (which can be used to generate an etchant gas and/or etching plasma), or combinations thereof. In some implementations, a wet etching process implements an etching solution that includes TMAH, $NH_4OH$, $H_2O_2$, $H_2SO_4$, HF, HCl, other suitable wet etching constituent, or combinations thereof. Various etching parameters can be tuned to selectively etch patterning layer 210 and substrate 205, such as etchant composition, etching temperature, etching solution concentration, etching time, etching pressure, source power, RF bias voltage, RF bias power, etchant flow rate, other suitable etching parameters, or combinations thereof. The present disclosure contemplates any combination of etching processes and/or other processes for defining fin structure 228A and fin structure 228B. Mandrel layer 220' can be removed (for example, by an etching process) after etching patterning layer 210 or substrate 205. The etching process can selectively etch mandrels 222A and dummy mandrels 222B without etching (or without significantly etching) patterning layer 210 and/or substrate 205. In some implementations, patterning layer 210 may be partially removed during the fin etching process. In some implementations, patterning layer 210 is omitted. In such implementations, mandrel layer 220 includes a material that is different than substrate 205 to achieve etching selectivity during an etching process, such that portions of substrate 205 can be selectively etched with minimal (or no) etching of mandrel layer 220', and vice versa. In such implementations, mandrel layer 220' can serves as an etch mask for patterning substrate 205.

Turning to FIG. 2E, an isolation layer 240 is formed over FinFET device 200. Isolation layer 240 covers a top surface of substrate 205, patterning layer 210, active fins 230A, and dummy fins 230B. Isolation layer 240 also completely fills trenches 232A and partially fills trench 232B, though the present disclosure contemplates embodiments where isolation layer 240 partially fills trenches 232A and/or completely fills trench 232B. Isolation layer 240 is subsequently patterned (which is described in detail below) to form an isolation feature, such as a shallow trench isolation feature, that electrically isolates active fins 230A from one another. Isolation layer 240 thus includes an isolation material, such as silicon oxide, silicon nitride, silicon oxynitride, other suitable isolation material (for example, including silicon, oxygen, nitrogen, carbon, and/or other suitable isolation constituent), or combinations thereof. In the depicted embodiment, isolation layer 240 includes an oxide material, such as silicon oxide, and can thus be referred to as an oxide layer. In some implementations, isolation layer 240 includes a multi-layer structure, such as a bulk dielectric layer disposed over a liner dielectric layer, where the bulk dielectric layer and the liner dielectric layer include materials depending on design requirements. In some implementations, isolation layer 240 includes a dielectric layer disposed over a doped liner layer (including, for example, boron silicate glass (BSG) or phosphosilicate glass (PSG)). Isolation layer 240 is deposited by CVD, physical vapor deposition (PVD), atomic layer deposition (ALD), high density plasma CVD (HDPCVD), metal organic CVD (MOCVD), remote plasma CVD (RPCVD), PECVD, LPCVD, atomic layer CVD (ALCVD), atmospheric pressure CVD (APCVD), other suitable deposition process, or combinations thereof.

Turning to FIG. 2F, a fin end cut process is performed to remove a portion of active fins 230A and a portion of dummy fins 230B, thereby defining FinFET device regions of FinFET device 200. In the depicted embodiment, the fin end cut process forms a trench 245 that divides fin active region 224 into a FinFET device region 250A and a FinFET device region 250B and fin active region 226 into a FinFET device region 250C and a FinFET device region 250D. Trench 245 has sidewalls defined end sidewalls of isolation layer 240, active fins 230A, dummy fins 230B, and patterning layer 210 and a bottom defined by the top surface of substrate 205. Each of FinFET device regions 250A-250D includes two active fins 230A and one dummy fin 230B. Adjacent FinFET device regions 250A-250D are separated by spacing S3 defined between dummy fins 230B along the x-direction, instead of spacing S2 defined between active fins 230A. For example, spacing S3 separates FinFET device region 250A and FinFET device region 250C, and spacing S3 separates FinFET device region 250B and FinFET device region 250D. Trench 245 creates an end-to-end spacing 252 between adjacent FinFET device regions along the y-direction. For example, ends of fins (often referred to as fin line ends) of FinFET device region 250A and ends of fins of FinFET device region 250B are separated by end-to-end spacing 252 and ends of fins of FinFET device region 250C and ends of fins of FinFET device region 250D are separated by end-to-end spacing 252.

The fin end cut process includes depositing a masking layer over isolation layer 140 (in some implementations, the masking layer fills trenches 232B); performing a lithography and etching process, such as those described herein, to define a cut pattern in the masking layer that exposes a portion of isolation layer 240; etching the exposed portion of isolation layer 240, thereby exposing a portion of active fins 230A and dummy fins 230B underlying isolation layer 240; etching the exposed portion of active fins 230A and dummy fins 230B; and removing the masking layer, thereby forming trench 245. The masking layer can be removed before or after etching the exposed portion of active fins 230A and dummy fins 230B. In some implementations, the masking layer is a resist layer. In some implementations, the masking layer is a hard mask layer, which is formed by depositing a hard mask layer over isolation layer 240 (in some implementations, the hard mask layer fills trenches 232B), forming a patterned resist layer having the cut pattern using a lithography process, such as those described herein, and etching the hard mask layer using the patterned resist layer as an etch mask, such that the patterned hard mask layer includes the cut pattern. In some implementations, the masking layer has a multi-layer structure. In some implementations, the exposed portion of isolation layer 140 is selectively etched without etching (or without significantly etching) the masking layer and/or the portion of active fins 230A and dummy fins 230B underlying isolation layer 140. In some implementations the exposed portion of active fins 230A and dummy fins 230B is selectively etched without etching (or without significantly etching) the masking layer and/or isolation layer 140. In some implementations, an etching process is tuned throughout to etch silicon oxide without etching (or without significantly etching) silicon, and vice versa, to remove the exposed portions of isolation layer 140, active fins 230A, and dummy fins 230B. In some implementations, a dry etching process uses a fluorine-containing precursor (for example, $CF_4$, $SF_6$, $NF_3$, $CH_2F_2$, $CHF_3$, and/or $C_2F_6$), an oxygen-containing precursor, a chlorine-containing precursor (for example, $Cl_2$, $CHCl_3$, $CCl_4$, and/or $BCl_3$), a bromine-containing precursor (for example, HBr and/or $CHBR_3$), an iodine-containing precursor, other suitable precursor (which can be used to generate an etchant gas and/or etching plasma), or combinations thereof. In some implementations, a wet etching process implements an etching solution that includes TMAH, $NH_4OH$, $H_2O_2$, $H_2SO_4$, HF, HCl, other suitable wet etching constituent, or combinations thereof. Various etching parameters can be tuned to selectively etch isolation layer 140, active fins 230A, and/or dummy fins 230B, such as etchant composition, etching temperature, etching solution concentration, etching time, etching pressure, source power, RF bias voltage, RF bias power, etchant flow rate, other suitable etching parameters, or combinations thereof. The present disclosure contemplates any combination of etching processes and/or other processes for removing portions of active fins 230A and dummy fins 230B to define FinFET device regions 250A-250D, as depicted in FIG. 2F.

Turning to FIG. 2G, an isolation layer 260 is formed over FinFET device 200. For example, isolation layer 260 covers isolation layer 240 and surfaces of FinFET device 200 that define trench 245 (for example, the end sidewalls of isolation layer 240, active fins 230A, dummy fins 230B, and/or patterning layer 210 and the top surface of substrate 205). In furtherance of the example, isolation layer 260 fills a remaining portion of trenches 232B (such that trenches 232B are completely filled by isolation layer 240 and isolation layer 260) and partially fills trench 245, though the present disclosure contemplates embodiments where isolation layer 260 partially fills trenches 232B and/or completely fills trench 245. Isolation layer 260 is subsequently patterned (which is described in detail below) to form an isolation feature, such as an STI feature, that electrically isolates FinFET device regions 250A-250D from one another. Isolation layer 260 thus includes an isolation material, such as silicon oxide, silicon nitride, silicon oxynitride, other suitable isolation material (for example, including silicon, oxygen, nitrogen, carbon, and/or other suitable isolation constituent), or combinations thereof. In some implementations, the isolation material is a high-k dielectric material (such that isolation layer 260 can be referred to as a high-k dielectric layer), such as hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric material (for example, including hafnium, lanthanum, aluminum, and/or other suitable high-k dielectric material constituent), or combinations thereof. High-k dielectric material generally refers to dielectric materials having a high dielectric constant, for example, greater than that of silicon oxide ($k \approx 3.9$). In the depicted embodiment, isolation layer 260 includes an isolation material that is different than the isolation material of isolation layer 240 to achieve etching selectivity during an etching process, such that isolation layer 260 can be etched without etching (or without significantly etching) isolation layer 240, and vice versa. For example, isolation layer 260 includes silicon, oxygen, carbon, and nitrogen, such as silicon oxycarbonitride (for example, SiOCN). In another example, isolation layer 260 includes a high-k dielectric material. In some implementations, isolation layer 260 includes a multi-layer structure, such as a bulk dielectric layer disposed over a liner dielectric layer, where the bulk dielectric layer and the liner dielectric layer include materials depending on design requirements. In some implementations, isolation layer 260 includes a dielectric layer disposed over a doped liner layer (including, for example, BSG or PSG). Isolation layer 260 is deposited by CVD, PVD, ALD, HDPCVD, MOCVD, RPCVD, PECVD, LPCVD, ALCVD, APCVD, other suitable deposition process, or combinations thereof.

Turning to FIG. 2H, an isolation layer 265 is formed over FinFET device 200. Isolation layer 265 fills a remaining portion of trench 245, such that trench 245 is completely filled by isolation layer 260 and isolation layer 265. Isolation layer 265 includes an isolation material that is different than the isolation material of isolation layer 260 to achieve etching selectivity during an etching process, such that isolation layer 265 can be etched without etching (or without significantly etching) isolation layer 260, and vice versa. In the depicted embodiment, isolation layer 265 is formed by a flowable CVD (FCVD) process, which includes depositing a flowable dielectric material (in some implementations, in a liquid state) over isolation layer 260 and converting the flowable dielectric material into a solid dielectric material (for example, by an annealing process). The flowable dielectric material flows into trench 245 and conforms to exposed surfaces of FinFET device 200, enabling void free filling of trench 245. For example, the FCVD process introduces a silicon-containing precursor and an oxidizer (collectively referred to as reactants) into a deposition chamber, where the silicon-containing precursor and the oxidizer react and condense onto exposed surfaces of isolation layer 260 to form a flowable dielectric material. In some implementations, the flowable dielectric material is a flowable silicon-oxygen-and-nitrogen containing material, where the flowable silicon-oxygen-and-nitrogen containing material includes Si—OH, Si—H, Si—O, and/or Si—N bonds. An annealing process can convert the flowable silicon-oxygen-and-nitrogen material into a silicon-and-oxygen containing layer, such as a silicon oxide layer. In such embodiments, the annealing process promotes formation of Si—Si and/or Si—O bonds and reduces Si—N and/or Si—H bonds. In some implementations, the annealing process converts Si—OH, Si—H, and/or Si—N bonds into Si—O bonds. In some implementations, the annealing process is a thermal annealing process that heats FinFET device 200 to a temperature that can facilitate conversion of the flowable dielectric material into the solid dielectric material. The thermal annealing process can heat FinFET device 200 via a substrate stage (on which substrate 205 is secured), a lamp source, a laser source, other source, or combinations thereof. In some implementations, the flowable dielectric material is exposed to UV radiation during the annealing process. Alternatively or additionally, isolation layer 265 is formed by a high aspect ratio process (HARP) (implementing, for example, a TEOS precursor and an $O_3$ precursor), HDPCVD (implementing, for example, an $SiH_4$ precursor and an $O_2$ precursor), other suitable process, or combinations thereof. Thereafter, a planarization process, such as a chemical mechanical polishing (CMP) process, is performed on the solid dielectric material until reaching and exposing isolation layer 260. In some implementations, top surfaces of isolation layer 265 and isolation layer 260 are substantially co-planar after the planarization process. In some implementations, an annealing process is subsequently performed to further cure and/or densify isolation layer 265.

Turning to FIG. 2I, an etch back process is performed on isolation layer 265. In the depicted embodiment, the etch back process reduces a thickness T1 of isolation layer 265 to a thickness T2, thereby forming a trench 267 between FinFET device regions 250A, 250B and FinFET device regions 250C, 250D. Trench 267 has sidewalls and a bottom defined by isolation layer 260. The etch back process is a dry etching process, a wet etching process, or combinations thereof configured to selectively etch isolation layer 265 without (or minimally) etching isolation layer 260. In some implementations, an etching chemistry of the etch back process is tuned to selectively etch silicon oxide without etching (or without significantly etching) silicon oxycarbonitride or a high-k dielectric material.

FIGS. 2J-2L depict a dummy fin replacement process, where dummy fins 230B are replaced with dielectric fins. Turning to FIG. 2J, dummy fins 230B are removed from FinFET device regions 250A-250D, thereby forming fin openings 270, which are subsequently filled with a dielectric material as described below. Removing dummy fins 230B includes depositing a masking layer over isolation layer 260 and isolation layer 265 (in some implementations, the masking layer fills trench 267); performing a lithography and etching process, such as those described herein, to define openings in the masking layer that expose dummy fins 230B (in the depicted embodiment, four opening are formed in the masking layer, where each opening exposes a portion of isolation layer 260 overlying a respective dummy fin 230B); etching the exposed portion of isolation layer 260, thereby exposing a portion of isolation layer 240 underlying isolation layer 260 that overlies dummy fins 230B; etching the exposed portion of isolation layer 240, thereby exposing patterning layer 210 disposed over dummy fins 230B; etching the exposed patterning layer 210, thereby exposing dummy fins 230; etching the exposed dummy fins 230B, thereby forming fin trenches 270; and removing the masking layer. In the depicted embodiment, dummy fins 230B are not completely removed, leaving remainder dummy fins 230B' that define bottoms of fin openings 270. In some implementations, dummy fins 230B are completely removed, such that the top surface of substrate 205 defines bottoms of fin openings 270. The masking layer can be removed before or after etching dummy fins 230B. In some implementations, the masking layer is a resist layer. In some implementations, the masking layer is a hard mask layer, which is formed by depositing a hard mask layer over isolation layer 260 and isolation layer 265 (in some implementations, the hard mask layer fills trench 267), forming a patterned resist layer having the opening using a lithography and etching process, such as those described herein, and etching the hard mask layer using the patterned resist layer as an etch mask, such that the patterned hard mask layer includes the opening. In some implementations, the masking layer has a multi-layer structure.

Various selective etching processes are performed to etch isolation layer 260, isolation layer 240, patterning layer 210, and dummy fins 230B to form fin openings 270. The exposed portion of isolation layer 260 is selectively etched without etching (or without significantly etching) the masking layer and/or isolation layer 240. For example, an etching chemistry of the etching process is tuned to selectively etch silicon oxycarbonitride or high-k dielectric material without etching (or without significantly etching) silicon oxide and/or resist material. The exposed portion of isolation layer 240 is selectively etched without etching (or without significantly etching) the masking layer, isolation layer 260, and/or patterning layer 210. For example, an etching chemistry of the etching process is tuned to selectively etch silicon oxide without etching (or without significantly etching) etching silicon nitride, resist material, silicon oxycarbonitride, and/or high-k dielectric material. The exposed patterning layer 210 disposed over dummy fins 230B is selectively etched without etching (or without significantly etching) the masking layer, isolation layer 265, isolation layer 240, and/or dummy fins 230B. For example, an etching chemistry of the etching process is tuned to selectively etch silicon nitride and/or silicon oxide without etching (or without significantly etching) etching silicon and/or a resist material. The exposed dummy fins 230B are selectively etched without etching (or without significantly etching) the masking layer, isolation layer 265, and/or isolation layer 240. For example, an etching chemistry of the etching process is tuned to selectively etch silicon without etching (or without significantly etching) silicon oxycarbonitride, high-k dielectric material, silicon oxide, and/or resist material. In the depicted embodiment, since patterning layer 210 includes some constituents in common with isolation layer 265 and isolation layer 240, isolation layer 265 and/or isolation layer 240 may be partially etched during etching of patterning layer 210. For example, where pad layer 212 of patterning layer 210 includes silicon oxide, mask layer 214 of patterning layer 210 includes silicon nitride, isolation layer 265 includes silicon oxycarbonitride, and isolation layer 240 includes silicon oxide, etching of patterning layer 210 partially etches isolation layer 265 and/or isolation layer 240 underlying the masking layer, such that fin openings 270 have a first portion having a first width (formed by etching isolation layer 265, isolation layer 240, and patterning layer 210) disposed over a second portion having a second width (formed by etching dummy fins 230B), where the first width is greater than the second width. In some implementations, etching mask layer 214 partially etches isolation layer 240 disposed under the masking layer and etching pad layer 212 partially etches isolation layer 240 disposed under the masking layer, which expands a width of fin openings 270. In some implementations, the selective etching processes utilize a dry etching process that implements a fluorine-containing precursor (for example, $CF_4$, $SF_6$, $NF_3$, $CH_2F_2$, $CHF_3$, and/or $C_2F_6$), an oxygen-containing precursor, a chlorine-containing precursor (for example, $Cl_2$, $CHCl_3$, $CCl_4$, and/or $BCl_3$), a bromine-containing precursor (for example, HBr and/or $CHBR_3$), an iodine-containing precursor, other suitable precursor (which can be used to generate an etchant gas and/or etching plasma), or combinations thereof. In some implementations, the selective etching processes utilize a wet etching process implements an etching solution that includes TMAH, $NH_4OH$, $H_2O_2$, $H_2SO_4$, HF, HCl, other suitable wet etching constituent, or combinations thereof. Various etching parameters can be tuned to selectively etch isolation layer 260, isolation layer 240, patterning layer 210, and/or dummy fins 230B, such as etchant composition, etching temperature, etching solution concentration, etching time, etching pressure, source power, RF bias voltage, RF bias power, etchant flow rate, other suitable etching parameters, or combinations thereof. The present disclosure contemplates any combination of etching processes and/or other processes for removing dummy fins 230B.

Turning to FIG. 2K, fin openings 270 are filled with a dielectric material. For example, a dielectric layer 280 is formed over FinFET device 200, and dielectric layer 285 is formed over dielectric layer 280. In the depicted embodiment, dielectric layer 280 fills fin openings 270 and trench 267, and dielectric layer 285 is disposed over a top surface of dielectric layer 280. Dielectric layer 280 and dielectric layer 285 include any suitable dielectric material, such as silicon oxide, silicon nitride, silicon oxynitride, other suitable dielectric material (for example, including silicon, oxygen, nitrogen, carbon, and/or other suitable dielectric constituent), or combinations thereof. In some implementations, the dielectric material is a high-k dielectric material (such that dielectric layer 280 and/or dielectric layer 285 can be referred to as a high-k dielectric layer), such as $HfO_2$, HfSiO, HfSiON, HfTaO, HfTiO, HfZrO, zirconium oxide, aluminum oxide, $HfO_2$—$Al_2O_3$ alloy, other suitable high-k dielectric material (for example, including hafnium, lanthanum, aluminum, and/or other suitable high-k dielectric material constituent), or combinations thereof. A material of dielectric layer 280 is different than a material of dielectric layer 285. In the depicted embodiment, a material of dielectric layer 280 is the same as a material of isolation layer 260, and a material of dielectric layer 285 is the same as a material of isolation layer 240. For example, dielectric layer 280 includes silicon, oxygen, carbon, and/or nitrogen, such as silicon oxycarbonitride or silicon oxycarbide (SiOC), and dielectric layer 285 includes silicon and oxygen, such as silicon oxide. In another example, dielectric layer 280 includes a metal oxide configured as a high-k dielectric material, such as $HfO_2$, $ZrO_2$, or $ZrSiO_2$, and dielectric layer 285 includes silicon oxide. The present disclosure further contemplates implementations where a material of dielectric layer 280 is different than a material of isolation layer 260, and a material of dielectric layer 285 is different than a material of isolation layer 240. In some implementations, dielectric layer 280 and/or dielectric layer 285 include a multi-layer structure. Dielectric layer 280 and/or dielectric layer 285 is deposited by CVD, PVD, ALD, HDPCVD, MOCVD, RPCVD, PECVD, LPCVD, ALCVD, APCVD, other suitable deposition process, or combinations thereof.

Turning to FIG. 2L, a planarization process, such as a CMP process, is performed until reaching active fins 230A, such that active fins 230A function as a planarization (or CMP) stop layer. The planarization process removes any dielectric material overlying (or above) top surfaces of active fins 230A, such as dielectric layer 285, a portion of dielectric layer 280, a portion of isolation layer 260, a portion of isolation layer 240, and patterning layer 210 disposed over active fins 230A, thereby forming dielectric fins 290, which replace dummy fins 230B. A width, a length, and a height of dielectric fins 290 is substantially the same as a width, a length, and a height of active fins 230A. In some implementations, the width is about 6 nm to about 11 nm. In the depicted embodiment, dielectric fins 290 include dielectric layer 280 disposed over remaining dummy fins 230B', such that dielectric fins 290 include a dielectric portion disposed over a semiconductor portion. In some implementations, a height of the dielectric portion of dielectric fins 290 (here, dielectric layer 280) is about 100 nm to about 200 nm. Alternatively, where dummy fins 230B are completely removed, dielectric fins 290 include dielectric layer 280, such that dielectric fins 290 include only the dielectric portion.

The planarization process also results in isolation features 240', a dielectric feature 292A, a dielectric feature 292B, and an isolation feature 294 of FinFET device 200. Isolation features 240', which include isolation layer 240, separate and isolate adjacent fins in each of FinFET device regions 250A-250D. For example, each of FinFET device regions 250A-250D includes two active fins 230A and one of dielectric fins 290, which are separated by isolation features 240'. Dielectric features 292A, 292B, both of which include isolation layer 260, separate adjacent FinFET device regions along a fin width direction (here, the x-direction). For example, dielectric features 292A separates FinFET device region 250A from FinFET device region 250C, and dielectric feature 292B separates FinFET device region 250B from FinFET device region 250D. Dielectric feature 292A is disposed between dielectric fins 290 of FinFET device regions 250A, 250C, and dielectric feature 292B is disposed between dielectric fins 290 of FinFET device regions 250B, 250D. In some implementations, dielectric features 292A, 292B are disposed in isolation features 240', such that isolation features 240' are disposed along sidewalls and bottoms of dielectric features 292A, 292B. Isolation feature 294 separates adjacent FinFET device regions along a fin length direction (here, the y-direction). For example, isolation feature 294 separates and isolates FinFET device region 250A from FinFET device region 250B and FinFET device region 250C from FinFET device region 250D. Isolation feature 294 is disposed between ends of active fins 230A of FinFET device regions 250A, 250B and ends of active fins 230A of FinFET device regions 250C, 250D. In the depicted embodiment, isolation feature 294 includes isolation layer 260, isolation layer 265, and isolation layer 280, where isolation layer 260 is configured as a liner layer of isolation feature 294 and isolation layer 265 and isolation layer 280 are configured as a bulk layer of isolation feature 294. In some implementations, top surfaces of active fins 230A, isolation layer 240, dielectric fins 290, dielectric feature 292A, dielectric feature 292B, and isolation feature 294 are substantially co-planar after the planarization process.

Turning to FIG. 2M, isolation features 240' are recessed, such that active fins 230A, dielectric fins 290, dielectric feature 292A, dielectric feature 292B, and isolation feature 294 extend (protrude) from between neighboring isolation features 240'. For example, isolation features 240' surround a bottom portion of active fins 230A, thereby defining upper fin active regions of active fins 230A (generally referring to a portion of active fins 230A that extend from a top surface of isolation features 240') and lower fin active regions of active fins 230A (generally referring to a portion of active fins 230A surrounded by isolation features 240', which extend from a top surface of substrate 205 to the top surface of isolation features 240'). In some implementations, an etch back process recesses isolation layer 240 until achieving a desired (target) height of upper fin active regions of active fins 230A. Isolation features 240' further surround a bottom portion of dielectric fins 290, dielectric feature 292A, dielectric feature 292B, and isolation feature 294. The etch back process is a dry etching process, a wet etching process, or combinations thereof. The etch back process selectively etches isolation layer 240 without etching (or without significantly etching) active fins 230A, dielectric fins 290, dielectric feature 292A, dielectric feature 292B, and/or isolation feature 294. For example, an etching chemistry is tuned to selectively etch silicon oxide without etching (or without significantly etching) silicon, silicon oxycarbonitride, and/or high-k dielectric material.

Turning to FIGS. 2N-2P, fabrication of FinFET device 200 can continue. For example, fabrication can continue with forming a dummy gate, forming epitaxial source/drain features, forming an interlevel dielectric (ILD) layer, replacing the dummy gate with a metal gate, and forming a multilayer interconnect structure. Turning to FIG. 2N, various gate structures are formed over active fins 230A and dielectric fins 290, such as a gate structure 300A, a gate structure 300B, a gate structure 300C, a gate structure 300D, and a gate structure 300E. Gate structures 300A-300E extend along the x-direction (for example, substantially perpendicular to active fins 230A and dielectric fins 290) and traverse fin structures of respective FinFET device regions 250A-250D, such that gate structures 300A-300E wrap upper fin active regions of respective active fins 230A and dielectric fins 290. Gate structure 300A is disposed over channel regions of active fins 230A in FinFET device regions 250A, 250C, and gate structure 300E is disposed over respective channel regions of active fins 230A in FinFET device regions 250B, 250D. Gate structures 300A, 300E wrap the channel regions of respective active fins 230A, thereby interposing respective source/drain regions of respective active fins 230A. Gate structures 300A, 300E engage the channel regions of respective fins 230A, such that current can flow between the source/drain regions of respective fins 230A during operation. Gate structure 300B wraps portions of active fins 230A in FinFET device regions 250A, 250C, positioned such that a source/drain region of active fins 230A in FinFET device regions 250A, 250C is disposed between gate structure 300B and gate structure 300A, and gate structure 300D wraps portions of active fins 230A in FinFET device regions 250B, 250D, positioned such that a source/drain region of active fins 230A in FinFET device regions 250B, 250D is disposed between gate structure 300D and gate structure 300E. Gate structures 300B, 300D are further partially disposed over isolation feature 294. Gate structure 300C is disposed over isolation feature 294. In some implementations, gate structures 300A, 300E are active gate structures, whereas gate structure 300B-300D are dummy gate structures. "Active gate structure" generally refers to an electrically functional gate structure of FinFET device 200, whereas "dummy gate structure" generally refers to an electrically non-functional gate structure of FinFET device 200. In some implementations, a dummy gate structure mimics physical properties of an active gate structure, such as physical dimensions of the active gate structure, yet is inoperable (in other words, does not enable current to flow). In some implementations, gate structures 300B-300D enable a substantially uniform processing environment, for example, enabling uniform epitaxial material growth in source/drain regions of active fins 230A (for example, when forming epitaxial source/drain features), uniform etch rates in source/drain regions of active fins 230A (for example, when forming source/drain recesses), and/or uniform, substantially planar surfaces (for example, by reducing (or preventing) CMP-induced dishing effects).

Gate structures 300A-300E include gate stacks configured to achieve desired functionality according to design requirements of FinFET device 200, such that gate structures 300A-300E include the same or different layers and/or materials. Gate structures 300A-300E are fabricated according to a gate last process, such that gate structures 300A-300E have dummy gates 302 in FIG. 2N, which are subsequently replaced with metal gates. Dummy gates 302 include, for example, an interfacial layer 304 (including, for example, silicon oxide), a dummy gate electrode 306 (including, for example, polysilicon), and a hard mask layer 308 (including, for example, silicon nitride). In some implementations, dummy gates 302 include a dummy gate dielectric disposed between dummy gate electrode 306 and interfacial layer 304. The dummy gate dielectric includes a dielectric material, such as silicon oxide, a high-k dielectric material, other suitable dielectric material, or combinations thereof. Dummy gates 302 can include numerous other layers, for example, capping layers, interface layers, diffusion layers, barrier layers, or combinations thereof. Dummy gates 302 are formed by deposition processes, lithography processes, etching processes, other suitable processes, or combinations thereof. For example, a deposition process is performed to form a dummy gate electrode layer over substrate 205, particularly over active fins 230A and dielectric fins 290. In some implementations, a deposition process is performed to form a dummy gate dielectric layer over active fins 230A and dielectric fins 290 before forming the dummy gate electrode layer, where the dummy gate electrode layer is formed over the dummy gate dielectric layer. The deposition process includes CVD, PVD, ALD, HDPCVD, MOCVD, RPCVD, PECVD, LPCVD, ALCVD, APCVD, plating, other suitable methods, or combinations thereof. A lithography patterning and etching process is then performed to pattern the dummy gate electrode layer (and, in some implementations, the dummy gate dielectric layer) to form dummy gates 302, such that dummy gates 302 wrap active fins 230A as depicted. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposing process is assisted, implemented, or replaced by other methods, such as maskless lithography, electron-beam writing, or ion-beam writing. In yet another alternative, the lithography patterning process implements nanoimprint technology. The etching processes include dry etching processes, wet etching processes, other etching methods, or combinations thereof.

Turning to FIG. 2O, processing continues with forming gate spacers 310 of gate structures 300A-300E. Gate spacers 310 are disposed adjacent to (for example, along sidewalls of) dummy gates 302. In some implementations, gate spacers 310 fill spaces between upper portions of active fins 230A, dielectric fins 290, dielectric feature 292A, and/or dielectric feature 292B. Gate spacers 310 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 205 and subsequently anisotropically etched to form gate spacers 310. In some implementations, gate spacers 310 include a multi-layer structure, such as a first dielectric layer that includes silicon nitride and a second dielectric layer that includes silicon oxide. In some implementations, gate spacers 310 include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over FinFET device 200 and subsequently anisotropically etched to form a first spacer set adjacent to the gate stacks, and a second dielectric layer including silicon and nitrogen can be deposited over FinFET device 200 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features (both of which are not shown) in source/drain regions of active fins 230A before and/or after forming gate spacers 310.

Source features and drain features (referred to as source/drain features) are formed in source/drain regions of active fins 230A. For example, semiconductor material is epitaxially grown on active fins 230A, forming epitaxial source/drain features 315. In the depicted embodiment, a fin recess process (for example, an etch back process) is performed on source/drain regions of active fins 230A, such that epitaxial source/drain features 315 are grown from recessed active fins 230A'. In some implementations, dielectric fins 290, dielectric feature 292A, dielectric feature 292B, isolation feature 294, and/or gate spacers 310 disposed between upper portions of active fins 230A and dielectric fins 290 are partially etched during the fin recess process and/or other etching process, such that a height of dielectric fins 290, dielectric feature 292A, dielectric feature 292B, and/or isolation feature 294 underlying gate structures 300A-300E is greater than a height of dielectric fins 290, dielectric feature 292A, dielectric feature 292B, and/or isolation feature 294 not underlying gate structures 300A-300E. In such implementations, such as depicted in FIG. 2O, dielectric fins 290 have a first portion having a top surface that is higher than a bottom surface of epitaxial source/drain features 315 and lower than a top surface of epitaxial source/drain features 315 (for example, the portion of dielectric fins 290 underlying gate structures 300A-300E) and a second portion having a top surface that is lower than the bottom surface of epitaxial source/drain features 315 (for example, the portion of dielectric fins 290 not underlying gate structures 300A-300E). In some implementations, source/drain regions of active fins 230 are not subjected to a fin recess process, such that epitaxial source/drain features 315 are grown from and wrap the upper fin active regions of active fins 230A. In furtherance of the depicted embodiment, epitaxial source/drain features 315 extend (grow) laterally along the x-direction (in some implementations, substantially perpendicular to recessed fins 230A'), such that epitaxial source/drain features 315 are merged epitaxial source/drain features that span more than one recessed active fin 230A'. In some implementations, epitaxial source/drain features 315 include partially merged portions (with interruption (or gaps) between epitaxial material grown from adjacent recessed active fins 230A') and/or fully merged portions (without interruption (or gaps) between epitaxial material grown from adjacent recessed active fins 230').

An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of recessed active fins 230A'. Epitaxial source/drain features 315 are doped with n-type dopants and/or p-type dopants. In the depicted embodiment, epitaxial source/drain features 315 are configured depending on a type of FinFET fabricated in their respective FinFET device region. For example, in FinFET device regions 250A-250D that are configured for n-type FinFETs, epitaxial source/drain features 315 can include epitaxial layers including silicon and/or carbon, where silicon-containing epitaxial layers or silicon-carbon-containing epitaxial layers are doped with phosphorous, arsenic, other n-type dopant, or combinations thereof (for example, forming an Si:P epitaxial layer, an Si:C epitaxial layer, or an Si:C:P epitaxial layer). In furtherance of the example, in FinFET device regions 250A-250D that are configured for p-type FinFETs, epitaxial source/drain features 315 can include epitaxial layers including silicon and/or germanium, where the silicon germanium containing epitaxial layers are doped with boron, carbon, other p-type dopant, or combinations thereof (for example, forming an Si:Ge:B epitaxial layer or an Si:Ge:C epitaxial layer). In some implementations, epitaxial source/drain features 315 include materials and/or dopants that achieve desired tensile stress and/or compressive stress in the channel regions. In some implementations, epitaxial source/drain features 315 are doped during deposition by adding impurities to a source material of the epitaxy process. In some implementations, epitaxial source/drain features 315 are doped by an ion implantation process subsequent to a deposition process. In some implementations, annealing processes are performed to activate dopants in epitaxial source/drain features 315 and/or other source/drain features of FinFET device 200, such as HDD regions and/or LDD regions.

Turning to FIG. 2P, an ILD layer 320 is formed over FinFET device 200, particularly over epitaxial source/drain features 315, gate structures 300A-300E, dielectric fins 290, dielectric feature 292A, dielectric feature 292B, and isolation feature 294. In some implementations, ILD layer 320 is a portion of a multilayer interconnect (MLI) feature that electrically couples various devices (for example, transistors, resistors, capacitors, and/or inductors) and/or components (for example, gate structures and/or source/drain features) of FinFET device 200, such that the various devices and/or components can operate as specified by design requirements of FinFET device 200. ILD layer 320 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some implementations, ILD layer 320 has a multilayer structure having multiple dielectric materials. In some implementations, a contact etch stop layer (CESL) is disposed between ILD layer 320 and epitaxial source/drain features 315, gate structures 300A-300E, dielectric fins 290, dielectric feature 292A, dielectric feature 292B, and/or isolation feature 294. The CESL includes a material different than ILD layer 320, such as a dielectric material that is different than the dielectric material of ILD layer 320. In the depicted embodiment, where ILD layer 320 includes a low-k dielectric material, the CESL includes silicon and nitrogen (for example, silicon nitride or silicon oxynitride). ILD layer 320 and/or the CESL is formed, for example, by a deposition process (such as CVD, PVD, ALD, FCVD, HDPCVD, MOCVD, RPCVD, PECVD, LPCVD, ALCVD, APCVD, plating, other suitable methods, or combinations thereof). Subsequent to the deposition of ILD layer 320 and/or the CESL, a CMP process and/or other planarization process is performed, such that a top portion of dummy gates 310 of gate structure 300A-300E (here, hard mask layers 308) is reached (exposed).

Dummy gates 302 of gate structures 300A-300E are then replaced with metal gates 330. In some implementations, dummy gates 302 are removed to form gate openings in gate structures 300A-300E (for example, having sidewalls defined by gate spacers 310) that expose upper fin active regions of a portion of active fins 230A and an upper portion of dielectric fins 290. In some implementations, a portion of dummy gates 302 is removed, such that gate openings expose an interfacial layer and/or a gate dielectric (and, in some implementations, a dummy gate dielectric) of dummy gates 302. The etching process is a dry etching process, a wet etching process, or combinations thereof. In some implementations, an etching process selectively removes dummy gates 302 without etching (or without significantly) etching ILD layer 320, gate spacers 310, and/or other features of FinFET device 200. In some implementations, a selective etching process can be tuned, such that dummy gate electrodes 306 (including, for example, polysilicon) are etched without etching (or without significantly etching) an interfacial layer and/or a dummy gate dielectric of dummy gates 302, gate spacers 310, ILD layer 320, and/or other feature of FinFET device 200. Metal gates 310 are then formed in the gate openings. Metal gates 310 are configured to achieve desired functionality according to design requirements of FinFET device 200, such that gate structures 300A-300E include the same or different layers and/or materials. In the depicted embodiment, metal gates 310 include gate dielectrics 332 and gate electrodes 334. In implementations where gate structures 300A-300E span a p-type FinFET and an n-type FinFET (for example, where FinFET device regions 250A, 250B are configured with p-type FinFETs and FinFET device regions 250C, 250D are configured with n-type FinFETs, or vice versa), the present disclosure contemplates that gate structures 300A-300E can include different layers in regions corresponding with the p-type FinFET and the n-type FinFET. For example, a number, configuration, and/or materials of layers of gate dielectrics 332 and/or gate electrodes 334 in FinFET device regions 250A, 250B may be different than a number, configuration, and/or materials of layers of gate dielectrics 332 and/or gate electrodes 334 in FinFET device regions 250C, 250D. In some implementations, isolation features 338 are formed to separate metal gates 330 of FinFET device regions 250A, 250C and metal gates 330 of FinFET device regions 250B, 250D. Isolation features 338 are formed by any suitable process, and in some implementations, include a dielectric material.

Gate dielectrics 332 include a dielectric material, such as silicon oxide, high-k dielectric material, other suitable dielectric material, or combinations thereof. Gate dielectrics 332 wrap upper fin active regions of a portion of active fins 230A and an upper region of a portion of dielectric fins 290. In the depicted embodiment, gate dielectrics 332 includes one or more high-k dielectric layers including, for example, hafnium, aluminum, zirconium, lanthanum, tantalum, titanium, yttrium, oxygen, nitrogen, other suitable constituent, or combinations thereof. In some implementations, the one or more high-k dielectric layers include $HfO_2$, HfSiO, HfSiON, HfTaO, HMO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. In some implementations, gate dielectrics 332 further include an interfacial layer (including a dielectric material, such as silicon oxide) disposed between the high-k dielectric layer and respective active fins 230A and isolation features 240'. In some implementations, gate dielectrics 332 are configured to tune work functions of respective FinFETs in FinFET device regions 250A-250D according to design requirements of FinFET device 200. Gate dielectrics 332 are formed by various processes, such as ALD, CVD, PVD, and/or other suitable process.

Gate electrodes 334 are respectively disposed over gate dielectrics 332. Gate electrodes 334 include an electrically conductive material. In some implementations, gate electrodes 334 includes multiple layers, such as one or more capping layers, work function layers, glue/barrier layers, and/or metal fill (or bulk) layers. A capping layer can include a material that prevents or eliminates diffusion and/or reaction of constituents between gate dielectrics 332 and other layers of gate structures 300A-300E (in particular, gate layers including metal). In some implementation, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer can include a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu. In some implementations, a hard mask layer (including, for example, silicon nitride or silicon carbide) is disposed over gate electrodes 334. Gate electrodes 334 are formed by various deposition processes, such as ALD, CVD, PVD, and/or other suitable process.

Various contacts can be formed to facilitate operation of FinFET device 200. For example, fabrication of the MLI feature can continue. The MLI feature includes a combination of dielectric layers (including ILD layer 320) and electrically conductive layers (for example, metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation of FinFET device 200, the interconnect features are configured to route signals between the devices and/or the components of FinFET device 200 and/or distribute signals (for example, clock signals, voltage signals, and/or ground signals) to the devices and/or the components of FinFET device 200. The present disclosure contemplates the MLI feature including any number and/or configuration of dielectric layers and/or conductive layers depending on design requirements of FinFET device 200.

In the depicted embodiment, device-level contacts 340, vias (not shown), and conductive lines (not shown) are formed in ILD layer 320 and/or other ILD layers of the MLI feature to form interconnect structures. Device-level contacts 340 (also referred to as local interconnects or local contacts) electrically couple and/or physically couple IC device features, such as features of FinFETs in FinFET device regions 250A-250D. For example, device-level contacts 340 are metal-to-device (MD) contacts, which generally refer to contacts to a conductive region, such as source/drain regions, of FinFET device 200. In the depicted embodiment, device-level contacts 340 are disposed on respective epitaxial source/drain features 315, such that device-level contacts 340 physically (or directly) connect the source/drain regions of FinFETs in FinFET device regions 250A-250D to the MLI feature (for example, to respective vias). Device-level contacts 340, vias, and conductive lines include any suitable electrically conductive material, such as Ta, Ti, Al, Cu, Co, W, TiN, TaN, other suitable conductive materials, or combinations thereof. Various conductive materials can be combined to provide device-level contacts 340, vias, and/or conductive lines with various layers, such as one or more barrier layers, adhesion layers, liner layers, bulk layers, other suitable layers, or combinations thereof. In some implementations, device-level-contacts 340 include Ti, TiN, and/or Co; vias include Ti, TiN, and/or W; and conductive lines include Cu, Co, and/or Ru. Device-level contacts 340, vias, and conductive lines are formed by patterning ILD layer 320 and/or other ILD layers of the MLI feature. Patterning the ILD layers can include lithography processes and/or etching processes to form openings (trenches), such as contact openings, via openings, and/or line openings in respective ILD layers. In some implementations, the lithography processes include forming a resist layer over respective ILD layers, exposing the resist layer to patterned radiation, and developing the exposed resist layer, thereby forming a patterned resist layer that can be used as a masking element for etching opening(s) in respective ILD layers. The etching processes include dry etching processes, wet etching processes, other etching processes, or combinations thereof. Thereafter, the opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of the ILD layers (for example, ILD layer 320), device-level contacts 340, vias, and/or conductive lines. The present disclosure contemplates any configuration of device-level contacts, vias, and/or conductive lines.

Fin-like field effect transistor (FinFET) patterning methods are disclosed herein for achieving fin width uniformity. Though method 100 is applied herein to form fins of FinFET devices of FinFET device 200, method 100 can be applied in numerous ways to form other IC features of IC devices. As one of many examples, the patterning techniques disclosed herein can be implemented to form gate features and/or other IC features with reduced etching loading effects. The present disclosure provides for many different embodiments.

An exemplary method includes forming a mandrel layer over a substrate and performing a first cut to remove a portion of the mandrel layer, thereby leaving a mandrel feature and a dummy mandrel feature disposed over the substrate. The dummy mandrel feature is disposed directly adjacent to the mandrel feature. The substrate is etched using the mandrel feature and the dummy mandrel feature as an etch mask, thereby forming a dummy fin feature and an active fin feature. The dummy fin feature is separated from the active fin feature by a first spacing along a first direction. A second cut is then performed to remove a portion of the dummy fin feature and a portion of the active fin feature, thereby forming dummy fins separated by a second spacing and active fins separated by the second spacing. The second spacing is along a second direction that is substantially perpendicular to the first direction. A third cut is then performed to remove the dummy fins, thereby forming fin openings. The fin openings are filled with a dielectric material, such as a high-k dielectric material or a material that includes silicon, oxygen, and carbon, thereby forming dielectric fins. In some implementations, the method further includes forming a first isolation layer over the dummy fin feature and the active fin feature before performing the second cut and forming a second isolation layer over the first isolation layer after performing the second cut. The first isolation layer fills a trench defined between the dummy fin feature and the active fin feature. A material of the second isolation layer is different than a material of the first isolation layer.

In some implementations, the mandrel feature is a first mandrel feature, the dummy mandrel feature is a first dummy mandrel feature, the dummy fin feature is a first dummy fin feature, the active fin feature is a first active fin feature, the dummy fins are first dummy fins, the active fins are first active fins, the fin openings are first fin openings, and the dielectric fins are first dielectric fins. In such implementations, performing the first cut can further include leaving a second mandrel feature and a second dummy mandrel feature disposed over the substrate. The second dummy mandrel feature is disposed directly adjacent to the second mandrel feature. In such implementations, etching the substrate can further include using the second mandrel feature and the second dummy mandrel feature as an etch mask, thereby forming a second dummy fin feature and a second active fin feature separated by the first spacing. In such implementations, performing the second cut can further include removing a portion of the second dummy fin feature and a portion of the second active fin feature, thereby forming second dummy fins separated by the second spacing and second active fins separated by the second spacing. In such implementations, performing the third cut can further include removing the second dummy fins, thereby forming second fin openings. In such implementations, filling the fin openings can further include forming second dielectric fins, wherein the first dielectric fins are separated from the second dielectric fins by a third spacing along the first direction, wherein the third spacing is greater than the first spacing.

In some implementations, the trench defined between the dummy fin feature and the active fin feature is a first trench defined between the first dummy fin feature and the first active fin feature. In such implementations, forming the first isolation layer can further include forming the first isolation layer over the second dummy fin feature and the second active fin feature, wherein the first isolation layer fills a second trench defined between the second dummy fin feature and the second active fin feature and partially fills a third trench defined between the second dummy fin feature and the first dummy fin feature. In such implementations, forming the second isolation layer over the first isolation layer can further include filling a remaining portion of the third trench and partially filling a fourth trench defined between ends of the first active fins, ends of the first dummy fins, ends of the second active fins, and ends of the second dummy fins. In some implementations, the method further includes forming a third isolation layer over the second isolation layer, wherein the third isolation layer partially fills the fourth trench and a material of the third isolation layer is different than a material of the first isolation layer and the second isolation layer.

In some implementations, performing the third cut includes performing a selective etch process to remove a portion of the second isolation layer and the first isolation layer to expose the first dummy fins and the second dummy fins and performing a selective etch process to remove the exposed first dummy fins and the exposed second dummy fins. In some implementations, filling the fin openings includes depositing a dielectric layer over the first isolation layer, the second isolation layer, and the third isolation layer and performing a planarization process to remove a portion of the dielectric layer, a portion of the second isolation layer, and a portion of the first isolation layer, thereby exposing the first active fins and the second active fins. The dielectric layer fills the first fin openings, the second fin openings, and a remaining portion of the fourth trench, and further wherein a material of the dielectric layer is the same as a material of the second isolation layer.

Another exemplary method includes forming a mandrel layer over a substrate and performing a fin cut process to pattern the mandrel layer to define a first fin active region and a second fin active region. The mandrel layer includes an array of mandrels separated by a first spacing, and the fin cut process removes a portion of the mandrel layer, such that a first mandrel and a first dummy mandrel of the array of mandrels remain over the substrate defining the first fin active region and a second mandrel and a second dummy mandrel of the array of mandrels remain over the substrate defining the second fin active region. The first dummy mandrel and the second dummy mandrel are separated by a second spacing that is greater than the first spacing. The first dummy mandrel and the second dummy mandrel are disposed between the first mandrel and the second mandrel. The method further includes etching the substrate using the patterned mandrel layer as an etch mask to form a first active fin feature and a first dummy fin feature in the first fin active region and a second active fin feature and a second dummy fin feature in the second fin active region. The method further includes performing a fin end cut process to pattern the first active fin feature, the first dummy fin feature, the second active fin feature, and the second dummy fin feature, thereby dividing the first active fin feature into first fins separated by an end-to-end spacing, the first dummy fin feature into first dummy fins separated by the end-to-end spacing, the second active fin feature into second fins separated by the end-to-end spacing, and the second dummy fin feature into second dummy fins separated by the end-to-end spacing. The method further includes replacing the first dummy fins and the second dummy fins with dielectric fins.

In some implementations, the method further includes forming a first isolation layer over the first active fin feature, the second active fin feature, the first dummy fin feature, and the second dummy fin feature before performing the fin end cut process. The first isolation layer fills first trenches defined between the first fin feature and the first dummy fin feature and between the second active fin feature and the second dummy fin feature. The first isolation layer also partially fills a second trench defined between the first dummy fin feature and the second dummy fin feature. In some implementations, the first isolation layer is etched back to form isolation features that isolate the first fins and the second fins from the dielectric fins. In some implementations, the method further includes forming a second isolation layer over the first isolation layer after performing the fin end cut process. The second isolation layer fills a remaining portion of the second trench and partially fills a third trench defined between ends of the first fins, ends of the first dummy fins, ends of the second fins, and ends of the second fins. In some implementations, the method further includes forming a third isolation layer over the second isolation layer. The third isolation layer partially fills the third trench. In some implementations, the third isolation layer is formed by performing a flowable chemical vapor deposition (FCVD) process to deposit an isolation material that fills the third trench and etching back the isolation material. In some implementations, the first dummy fins and the second dummy fins are replaced with dielectric fins by etching a portion of the second isolation layer and the first isolation layer, Exposed first dummy fins and the second dummy fins are then etched to form fin openings, which are filled with a dielectric material. In some implementations, filling the fin openings with the dielectric layer includes depositing a dielectric layer over the first isolation layer, the second isolation layer, and the third isolation layer and performing a planarization process until reaching the first fins and the second fins. The dielectric layer fills the fin openings and a remaining portion of the third trench.

An exemplary integrated circuit device includes a fin-like field effect transistor (FinFET) device having a fin structure that includes a dielectric fin and an active fin extending along a first direction. The dielectric fin is disposed directly adjacent to the active fin. A width of the dielectric fin is substantially the same as a width of the active fin. An isolation feature is disposed between the dielectric fin and the active fin. A dielectric material of the dielectric fin is different than a dielectric material of the isolation feature. A gate structure is disposed over a portion of the dielectric fin and the active fin, wherein the gate structure extends along a second direction that is substantially perpendicular to the first direction.

In some implementations, the FinFET device is a first FinFET device, the fin structure is a first fin structure, the dielectric fin is a first dielectric fin, the active fin is a first active fin, and the isolation feature is a first isolation feature. In such implementations, the integrated circuit device further includes a second FinFET device having a second fin structure that includes a second dielectric fin and a second active fin extending along the first direction. The second dielectric fin is disposed directly adjacent to the second active fin. A width of the second dielectric fin is substantially the same as a width of the second active fin. A second isolation feature is disposed between the second dielectric fin and the second active fin. A dielectric material of the second dielectric fin is different than a dielectric material of the second isolation feature. In furtherance of such implementations, the gate structure is further disposed over a portion of the second dielectric fin and the second active fin, the first active fin and the first dielectric fin are separated by a first spacing, the second active fin and the second dielectric fin are separated by the first spacing, and the first dielectric fin and the second dielectric fin are disposed between the first active fin and the second active fin. The first dielectric fin and the second dielectric fin are separated by a second spacing that is greater than the first spacing. In some implementations, the integrated circuit device further includes a dielectric feature disposed between the first dielectric fin and the second dielectric fin. A width of the dielectric feature is greater than the width of the first dielectric fin and the width of the second dielectric fin. In some implementations, the dielectric feature is separated from the first dielectric fin and the second dielectric fin by the first spacing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a mandrel layer over a substrate;
   performing a first cut to remove a portion of the mandrel layer, thereby leaving a mandrel feature and a dummy mandrel feature disposed over the substrate, wherein the dummy mandrel feature is disposed directly adjacent to the mandrel feature;
   etching the substrate using the mandrel feature and the dummy mandrel feature as an etch mask, thereby forming a dummy fin feature and an active fin feature, wherein the dummy fin feature is separated from the active fin feature by a first spacing along a first direction;
   performing a second cut to remove a portion of the dummy fin feature and a portion of the active fin feature, thereby forming dummy fins separated by a second spacing and active fins separated by the second spacing, wherein the second spacing is along a second direction that is perpendicular to the first direction;
   performing a third cut to remove the dummy fins, thereby forming fin openings; and
   filling the fin openings with a dielectric material, thereby forming dielectric fins.

2. The method of claim 1, wherein the filling the fin openings with the dielectric material includes depositing a high-k dielectric material.

3. The method of claim 1, wherein the filling the fin openings with the dielectric material includes depositing a material that includes silicon, oxygen, and carbon.

4. The method of claim 1, further comprising:
   forming a first isolation layer over the dummy fin feature and the active fin feature before performing the second cut, wherein the first isolation layer fills a trench defined between the dummy fin feature and the active fin feature; and
   forming a second isolation layer over the first isolation layer after performing the second cut, wherein a material of the second isolation layer is different than a material of the first isolation layer.

5. The method of claim 4, wherein:
   the mandrel feature is a first mandrel feature, the dummy mandrel feature is a first dummy mandrel feature, the dummy fin feature is a first dummy fin feature, the active fin feature is a first active fin feature, the dummy fins are first dummy fins, the active fins are first active fins, the fin openings are first fin openings, and the dielectric fins are first dielectric fins;
   the performing the first cut further includes leaving a second mandrel feature and a second dummy mandrel feature disposed over the substrate, wherein the second dummy mandrel feature is disposed directly adjacent to the second mandrel feature;
   the etching the substrate further includes using the second mandrel feature and the second dummy mandrel feature as an etch mask, thereby forming a second dummy fin feature and a second active fin feature separated by the first spacing;
   the performing the second cut further includes removing a portion of the second dummy fin feature and a portion of the second active fin feature, thereby forming second dummy fins separated by the second spacing and second active fins separated by the second spacing;
   the performing the third cut further includes removing the second dummy fins, thereby forming second fin openings; and
   the filling the fin openings further includes forming second dielectric fins, wherein the first dielectric fins are separated from the second dielectric fins by a third spacing along the first direction, wherein the third spacing is greater than the first spacing.

6. The method of claim 5, wherein:
   the trench defined between the dummy fin feature and the active fin feature is a first trench defined between the first dummy fin feature and the first active fin feature;
   the forming the first isolation layer further includes forming the first isolation layer over the second dummy fin feature and the second active fin feature, wherein the first isolation layer fills a second trench defined between the second dummy fin feature and the second active fin feature and partially fills a third trench defined between the second dummy fin feature and the first dummy fin feature; and
   the forming the second isolation layer over the first isolation layer further includes filling a remaining portion of the third trench and partially filling a fourth trench defined between ends of the first active fins, ends of the first dummy fins, ends of the second active fins, and ends of the second dummy fins.

7. The method of claim 6, further comprising forming a third isolation layer over the second isolation layer, wherein the third isolation layer partially fills the fourth trench and a material of the third isolation layer is different than a material of the first isolation layer and the second isolation layer.

8. The method of claim 7, wherein:
   the performing the third cut includes:
      performing a selective etch process to remove a portion of the second isolation layer and the first isolation layer to expose the first dummy fins and the second dummy fins, and
      performing a selective etch process to remove the exposed first dummy fins and the exposed second dummy fins; and
   the filling the fin openings includes:
      depositing a dielectric layer over the first isolation layer, the second isolation layer, and the third isolation layer, wherein the dielectric layer fills the first fin openings, the second fin openings, and a remaining portion of the fourth trench, and further wherein a material of the dielectric layer is the same as a material of the second isolation layer, and
      performing a planarization process to remove a portion of the dielectric layer, a portion of the second isolation layer, and a portion of the first isolation layer, thereby exposing the first active fins and the second active fins.

9. A method comprising:
   forming a mandrel layer over a substrate, wherein the mandrel layer includes an array of mandrels separated by a first spacing;
   performing a fin cut process to pattern the mandrel layer to define a first fin active region and a second fin active region, wherein the fin cut process removes a portion of the mandrel layer, such that a first mandrel and a first dummy mandrel of the array of mandrels remain over the substrate defining the first fin active region and a second mandrel and a second dummy mandrel of the array of mandrels remain over the substrate defining the second fin active region, wherein the first dummy mandrel and the second dummy mandrel are separated by a second spacing that is greater than the first spacing, wherein the first dummy mandrel and the second dummy mandrel are disposed between the first mandrel and the second mandrel;

etching the substrate using the patterned mandrel layer as an etch mask to form a first active fin feature and a first dummy fin feature in the first fin active region and a second active fin feature and a second dummy fin feature in the second fin active region;

performing a fin end cut process to pattern the first active fin feature, the first dummy fin feature, the second active fin feature, and the second dummy fin feature, thereby dividing the first active fin feature into first fins separated by an end-to-end spacing, the first dummy fin feature into first dummy fins separated by the end-to-end spacing, the second active fin feature into second fins separated by the end-to-end spacing, and the second dummy fin feature into second dummy fins separated by the end-to-end spacing; and replacing the first dummy fins and the second dummy fins with dielectric fins.

10. The method of claim 9, further comprising forming a first isolation layer over the first active fin feature, the second active fin feature, the first dummy fin feature, and the second dummy fin feature before performing the fin end cut process, wherein the first isolation layer fills first trenches defined between the first active fin feature and the first dummy fin feature and between the second active fin feature and the second dummy fin feature and partially fills a second trench defined between the first dummy fin feature and the second dummy fin feature.

11. The method of claim 10, further comprising forming a second isolation layer over the first isolation layer after performing the fin end cut process, wherein the second isolation layer fills a remaining portion of the second trench and partially fills a third trench defined between ends of the first fins, ends of the first dummy fins, ends of the second fins, and ends of the second fins.

12. The method of claim 11, further comprising forming a third isolation layer over the second isolation layer, wherein the third isolation layer partially fills the third trench.

13. The method of claim 12, wherein the forming the third isolation layer includes:
performing a flowable chemical vapor deposition (FCVD) process to deposit an isolation material that fills the third trench; and
etching back the isolation material.

14. The method of claim 12, wherein the replacing the first dummy fins and the second dummy fins with dielectric fins includes:
etching a portion of the second isolation layer and the first isolation layer, thereby exposing the first dummy fins and the second dummy fins;
etching the exposed first dummy fins and the second dummy fins, thereby forming fin openings; and
filling the fin openings with a dielectric layer.

15. The method of claim 14, wherein the filling the fin openings includes:
depositing a dielectric layer over the first isolation layer, the second isolation layer, and the third isolation layer, wherein the dielectric layer fills the fin openings and a remaining portion of the third trench; and
performing a planarization process until reaching the first fins and the second fins.

16. The method of claim 14, further comprising etching back the first isolation layer to form isolation features that isolate the first fins and the second fins from the dielectric fins.

17. A method comprising:
forming an array of semiconductor fins over a substrate, wherein the array of semiconductor fins includes a first semiconductor fin in a first fin active region, a second semiconductor fin in a second fin active region, a first dummy semiconductor fin in the first fin active region separated from the first semiconductor fin by a first spacing, and a second dummy semiconductor fin in the second fin active region separated from the second semiconductor fin by the first spacing, wherein the first dummy semiconductor fin and the second semiconductor dummy fin are disposed between the first semiconductor fin and the second semiconductor fin, the first dummy semiconductor fin and the second dummy semiconductor fin are separated by a second spacing, and the second spacing is different than the first spacing;

after forming an isolation layer over the substrate, replacing the first dummy semiconductor fin and the second semiconductor dummy fin with a first dielectric fin and a second dielectric fin, wherein the isolation layer fills the first spacing between the first dummy semiconductor fin and the first semiconductor fin, the first spacing between the second dummy semiconductor fin and the second semiconductor fin, and the second spacing between the first dummy semiconductor fin and the second dummy semiconductor fin;

recessing the isolation layer to expose a first upper portion of the first semiconductor fin, a second upper portion of the second semiconductor fin, a third upper portion of the first dielectric fin, and a fourth upper portion of the second dielectric fin; and forming a gate structure over the first upper portion of the first semiconductor fin, the second upper portion of the second semiconductor fin, the third upper portion of the first dielectric fin, and a fourth upper portion of the second dielectric fin.

18. The method of claim 17, further comprising forming first source/drain features over the first upper portion of the first semiconductor fin and second source/drain features over the second upper portion of the second semiconductor fin, wherein the gate structure is disposed between the first source/drain features and between the second source/drain features.

19. The method of claim 17, wherein the forming the isolation layer over the substrate includes:
depositing a first isolation layer over the substrate, wherein the first isolation layer fills the first spacing between the first dummy semiconductor fin and the first semiconductor fin, the first isolation layer fills the first spacing between the second dummy semiconductor fin and the second semiconductor fin, and the first isolation layer partially fills the second spacing between the first dummy semiconductor fin and the second dummy semiconductor fin; and
depositing a second isolation layer over the first isolation layer, wherein the second isolation layer fills a remainder of the second spacing between the first dummy semiconductor fin and the second dummy semiconductor fin.

20. The method of claim 19, wherein the recessing the isolation layer includes etching back the first isolation layer without etching back the second isolation layer.

* * * * *